(12) United States Patent
Taylor

(10) Patent No.: US 9,590,136 B2
(45) Date of Patent: Mar. 7, 2017

(54) SEMICONDUCTOR DEVICE FOR OPTOELECTRONIC INTEGRATED CIRCUITS

(71) Applicants: Opel Solar, Inc., Storrs Mansfield, CT (US); The University of Connecticut, Farmington, CT (US)

(72) Inventor: Geoff W. Taylor, Mansfield, CT (US)

(73) Assignees: Opel Solar, Inc., Mansfield, CT (US); THE UNIVERSITY OF CONNECTICUT, Farmington, CT (US)

( * ) Notice: Subject to any disclaimer, the term of this patent is extended or adjusted under 35 U.S.C. 154(b) by 0 days.

(21) Appl. No.: 14/736,624

(22) Filed: Jun. 11, 2015

(65) Prior Publication Data
US 2016/0365476 A1    Dec. 15, 2016

(51) Int. Cl.
| | |
|---|---|
| *H01L 29/06* | (2006.01) |
| *H01L 31/102* | (2006.01) |
| *H01L 21/02* | (2006.01) |
| *H01L 21/70* | (2006.01) |
| *H01L 33/00* | (2010.01) |
| *H01L 33/02* | (2010.01) |
| *H01L 33/04* | (2010.01) |

(52) U.S. Cl.
CPC ...... *H01L 33/0062* (2013.01); *H01L 33/0025* (2013.01); *H01L 33/0041* (2013.01); *H01L 33/025* (2013.01); *H01L 33/04* (2013.01)

(58) Field of Classification Search
CPC ............. H01L 33/0062; H01L 33/0025; H01L 33/0041; H01L 33/04
USPC .... 257/22, 183, 184, 195, 526, 623; 438/45, 438/47, 495; 372/45.012
See application file for complete search history.

(56) References Cited

U.S. PATENT DOCUMENTS

| | | | |
|---|---|---|---|
| 5,698,900 A * | 12/1997 | Bozada | ............ H01L 21/28575 257/194 |
| 5,804,847 A | 9/1998 | Robinson | |
| 6,031,243 A | 2/2000 | Taylor | |
| 6,479,844 B2 | 11/2002 | Taylor | |

(Continued)

OTHER PUBLICATIONS

"Development of Refractory Ohmic Contact Materials for Gallium Arsenide Compound Semiconductors", Masanori Murakami, Science and Technology of Advanced Materials 3 (2002) pp. 1-27.

(Continued)

*Primary Examiner* — Dzung Tran
(74) *Attorney, Agent, or Firm* — Sughrue Mion, PLLC

(57) ABSTRACT

A semiconductor device includes a series of layers formed on a substrate, including a first plurality of n-type layers, a second plurality of layers that form a p-type modulation doped quantum well structure (MDQWS), a third plurality of layers disposed between the p-type MDQWS and a fourth plurality of layers that form an n-type MDQWS, and a fifth plurality of p-type layers. The first plurality of layers includes a first etch stop layer of n-type formed on an n-type contact layer. The third plurality of layers includes a second etch stop layer formed above the p-type MDQWS and a third etch stop layer formed above and offset from the second etch stop layer. The fifth plurality of layers includes a fourth etch stop layer of p-type formed above the n-type MDQWS and a fifth etch stop layer of p-type doping formed above and offset from the fourth etch stop layer.

7 Claims, 44 Drawing Sheets

(56) References Cited

U.S. PATENT DOCUMENTS

| | | | |
|---|---|---|---|
| 6,841,795 B2 | 1/2005 | Taylor et al. | |
| 6,849,866 B2 | 2/2005 | Taylor | |
| 6,853,014 B2 | 2/2005 | Taylor et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 6,995,407 B2 | 2/2006 | Taylor et al. | |
| 7,332,752 B2 | 2/2008 | Taylor et al. | |
| 2003/0080331 A1* | 5/2003 | Ono | H01L 27/0605 257/14 |
| 2004/0079963 A1* | 4/2004 | Taylor | H01L 29/155 257/183 |
| 2004/0081216 A1* | 4/2004 | Dehmubed | H01L 29/155 372/50.124 |
| 2006/0141651 A1* | 6/2006 | Taylor | H03M 1/74 438/47 |
| 2006/0141682 A1* | 6/2006 | Taylor | H01L 29/155 438/142 |
| 2006/0208279 A1* | 9/2006 | Robinson | H01L 29/7785 257/194 |
| 2014/0050242 A1 | 2/2014 | Taylor | |

OTHER PUBLICATIONS

"InXGa1-XAs Ohmic Contacts to n-Type GaAs with a Tungsten Nitride Barrier", Chihiro J. Uchibori et al., Journal of Electronic Materials, vol. 26, No. 4, 1997.

Selective RIE in BC13/SF6 Plasmas for GaAs Hemt Gate Recess Etching, Y.S. Lee et al., Department of Chemical and Petroleum Engineering, University of Kansas, 2000.

U.S. Appl. No. 08/949,504, filed Oct. 14, 1997, Geoff W. Taylor.
U.S. Appl. No. 09/710,217, filed Nov. 11, 2000, Geoff W. Taylor.
U.S. Appl. No. 60/376,238, filed Apr. 26, 2002, Geoff W. Taylor.
U.S. Appl. No. 14/222,841, filed Mar. 24, 2014, Geoff W. Taylor.

* cited by examiner

| layer material | layer doping type | typical doping concentration (atoms/cm3) | typical layer thickness (A) | label | label in Fig. 1 | Notes |
|---|---|---|---|---|---|---|
| GaAs | UD | | 250 | 179 | 46 | |
| GaAs | P++ | 1E20 | 600 | 177 | 44 | top ohmic contact |
| GaAs | P++ | 7E18 | 748 | 175 | 44 | |
| GaAs | P++ | 7E18 | 6 | 173 | 42 | |
| Al(0.7)Ga(0.3)As | P++ | 7E18 | 10 | 171 | 42 | optical waveguide cladding and confinement |
| Al(0.7)Ga(0.3)As | P | 5E17 | 611 | 169 | 42 | |
| AlAs | P | 5E17 | 600 | 167 | 40 | etch stop to form mesa for gate of NHFET |
| AlAs | P++ | 7E18 | 20 | 165 | 40 | capping layer |
| GaAs | P++ | 7E18 | 12 | 163 | 38 | top plate of top capacitor |
| Al(0.15)Ga(0.85)As | P++ | 7E18 (2) | 112 | 161 | 38 | |
| AlAs | P++ | 7E18 | 8 | 159 | 36 | etch stop to form mesa for n-channel contact(s) |
| Al(0.15)Ga(0.85)As | UD | | 140 | 157 | 34 | |
| Al(0.15)Ga(0.85)As | N+ | 3.5E18 (2) | 45 | 155 | 32 | N+ charge sheet - bottom plate of top capacitor and modulation doping layer |
| Al(0.15)Ga(0.85)As | UD | | 15 | 153 | 32 | N-type Modulation Doped QW structure |
| GaAs | UD | | 15 | 151 | 32 | |
| In(0.2)Ga(0.8)As ] x 2 | UD | | 60 | 149 | 32 | |
| GaAs ] x 2 | UD | | 100 | 147 | 32 | |
| GaAs | UD | | 150 | 145 | 32 | |
| Al(0.15)Ga(0.85)As | UD | | 1600 | 143 | 30 | spacer - collector region for NHFET |
| AlAs | UD | | 8 | 141 | 28 | etch stop to form mesa for collector of NHFET and PHFET |
| Al(0.15)Ga(0.85)As | UD | | 500 | 139 | 26 | spacer - collector region for PHFET |
| AlAs | UD | | 8 | 137 | 24 | etch stop to form mesa for p-channel contact(s) |
| GaAs | UD | | 150 | 135 | 22 | P-type Modulation Doped QW structure |

FIG. 2A

| layer material | layer doping type | typical doping concentration (atoms/cm3) | typical layer thickness (A) | label | label in Fig. 1 | Notes |
|---|---|---|---|---|---|---|
| GaAs ] x 2 | UD | | 100 | 133 | 22 | |
| In(0.2)Ga(0.8)As ] x 2 | UD | | 60 | 131 | 22 | |
| GaAs | UD | | 15 | 127 | 22 | |
| Al(0.15)Ga(0.85)As | UD | | 15 | 125 | 22 | |
| Al(0.15)Ga(0.85)As | P+ | 7E18 (2) | 45 | 123 | 22 | P+ charge sheet - top plate of bottom capacitor and modulation doping layer |
| Al(0.15)Ga(0.85)As | UD | | 140 | 121 | 20 | |
| Al(0.15)Ga(0.85)As | N+ | 3.5E18 (2) | 80 | 119 | 18 | bottom plate of bottom capacitor |
| GaAs | N+ | 3.5E18 | 12 | 117 | 18 | optical waveguide cladding and confinement |
| Al(0.15)Ga(0.85)As | N+ | 3.5E18 | 20 | 115 | 18 | |
| GaAs | N+ | 3.5E18 | 12 | 113 | 18 | |
| AlAs | N+ | 3.5E18 (2) | 759 | 111 | 16 | etch stop to form mesa at bottom ohmic contact |
| GaAs | N+ | 3.5E18 (8) | 1848 | 109 | 14 | bottom ohmic contact |
| AlAs | UD | | | 107 | 12 | bottom DBR mirror |
| GaAs | UD | | | 105 | 12 | |
| AlAs | UD | | | 103 | 12 | |
| GaAs Substrate | SI | | | 101 | 10 | |

FIG. 2B

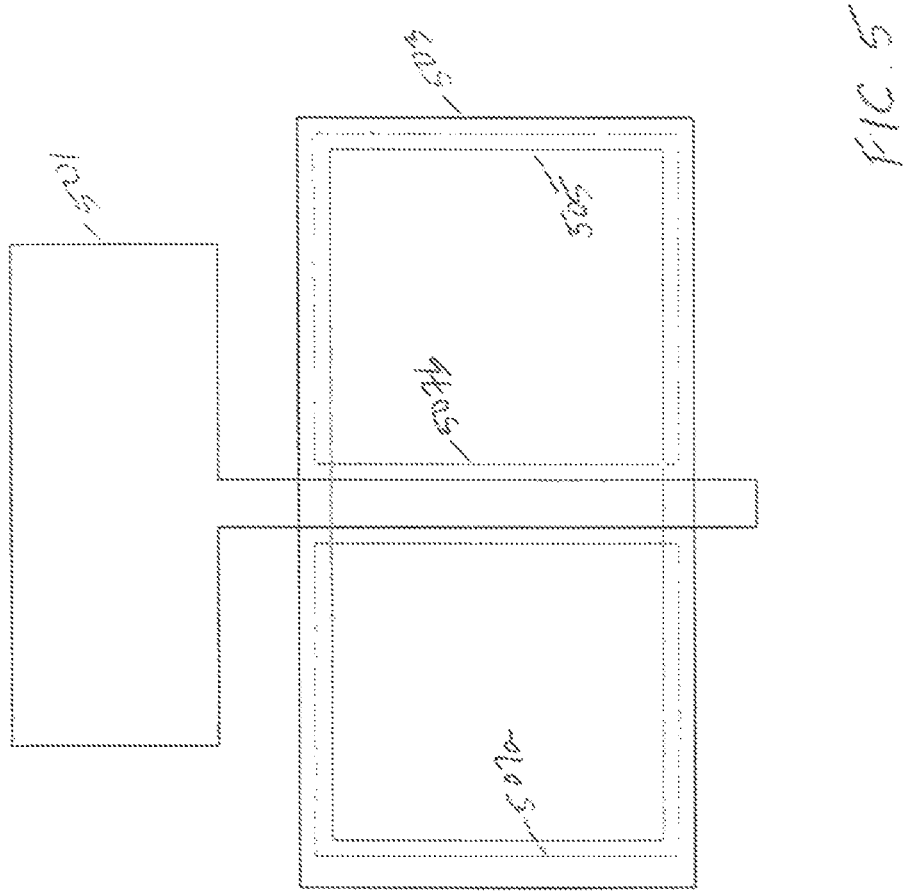

SEMICONDUCTOR DEVICE FOR OPTOELECTRONIC INTEGRATED CIRCUITS

BACKGROUND

1. Field

The present application relates to semiconductor integrated circuits that implement a variety of optoelectronic functions (such as optical emitters, optical detectors, and optical switches) and electronic functions (such as heterojunction field effect transistors), as well as fabrications methods for such integrated circuits.

2. State of the Art

The present application builds upon technology (referred to by the Applicant as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; U.S. patent application Ser. No. 13/921,311, filed on Jun. 19, 2013; and U.S. patent application Ser. No. 14/222,841, filed on Mar. 24, 2014, all of which are hereby incorporated by reference in their entireties.

With these structures, a fabrication sequence can be used to make the devices on a common substrate. In other words, n type and p type contacts, critical etches, etc., can be used to realize all of these devices simultaneously on a common substrate. The essential features of this device structure include: 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures are preferably realized with a material system of group III-V materials (such as GaAs/AlGaAs).

POET can be used to construct a variety of optoelectronic devices. POET can also be used to construct a variety of high performance transistor devices, such as complementary NHFET and PHFET unipolar devices as well as n-type and p-type HBT bipolar devices.

SUMMARY

A semiconductor device includes a series of layers formed on a substrate, which includes a first plurality of layers comprising n-type dopant material, a second plurality of layers that form a p-type modulation doped quantum well structure, a third plurality of layers disposed between the p-type modulation doped quantum well structure and a fourth plurality of layers that form an n-type modulation doped quantum well structure, and a fifth plurality of layers comprising p-type dopant material. The first plurality of layers includes an n-type ohmic contact layer and a first etch stop layer of n-type doping formed on the n-type ohmic contact layer. The third plurality of layers includes a second etch stop layer formed above the p-type modulation doped quantum well structure and a third etch stop layer formed above and offset from the second etch stop layer. The fifth plurality of layers includes a p-type ohmic contact layer, a fourth etch stop layer of p-type doping formed above the n-type modulation doped quantum well structure and a fifth etch stop layer of p-type doping formed above and offset from the fourth etch stop layer.

The second etch stop layer and third etch stop layer can be undoped.

The first etch stop layer, the second etch stop layer, the third etch stop layer, the fourth etch stop layer and the fifth etch stop layer can each include AlAs.

The series of layers can include III-V semiconductor materials (such as GaAs materials).

A method of fabricating an integrated circuit can include etching the semiconductor device with an etchant that automatically stops at the fifth etch stop layer in order to form at least one mesa at the layer underlying the fifth etch stop layer. The layer underlying the fifth etch stop layer can form a gate region of an n-channel HFET such that the mesa defines an interface to the gate region of the n-channel HFET. The fifth etch stop layer can include AlAs, and the etching operations that automatically stops at the fifth etch stop layer uses citric acid as the etchant. BHF can be used to remove the fifth etch stop layer and expose the mesa at the layer underlying the fifth etch stop layer.

The method can further include etching the semiconductor device with an etchant that automatically stops at the fourth etch stop layer in order to form at least one mesa at the layer underlying the fourth etch stop layer. The layer underlying the fourth etch stop layer can encompass n-type ion-implanted contact regions that contact the n-type modulation doped quantum well structure. The fourth etch stop layer can include AlAs, and the etching operations that automatically stops at the fourth etch stop layer uses citric acid as the etchant. BHF can be used to remove the fourth etch stop layer and expose the mesa at the layer underlying the fourth etch stop layer.

The method can further include etching the semiconductor device with an etchant that automatically stops at the third etch stop layer in order to form at least one mesa at the layer underlying the third etch stop layer. In one embodiment, the layer underlying the third etch stop layer can form a collector region of an n-channel HFET such that the mesa defines an interface to the collector region of the n-channel HFET. In another embodiment, the layer underlying the third etch stop layer can form a collector region of a p-channel HFET such that the mesa defines an interface to the collector region of the p-channel HFET. The third etch stop layer can include AlAs, and the etching operations that automatically stops at the third etch stop layer uses citric acid as the etchant. BHF can be used to remove the third etch stop layer and expose the mesa at the layer underlying the third etch stop layer.

The method can further include etching the semiconductor device with an etchant that automatically stops at the second etch stop layer in order to form at least one mesa at the layer underlying the second etch stop layer. The layer underlying the second etch stop layer can encompass p-type ion-implanted contact regions that contact the p-type modulation doped quantum well structure. The second etch stop layer can include AlAs, and the etching operations that automatically stops at the second etch stop layer uses citric acid as the etchant. BHF can be used to remove the second etch stop layer and expose the mesa at the layer underlying the second etch stop layer.

The method can further include etching the semiconductor device with an etchant that automatically stops at the first etch stop layer in order to form at least one mesa at the n-type ohmic contact layer underlying the first etch stop layer. The first etch stop layer can include AlAs, and the etching operations that automatically stops at the first etch stop layer uses citric acid as the etchant. BHF can be used to remove the first etch stop layer and expose the mesa at the n-type ohmic contact layer underlying the first etch stop layer.

BRIEF DESCRIPTION OF THE DRAWINGS

FIGS. 2A and 2B, collectively, is a chart illustrating an exemplary layer structure for realizing the optoelectronic integrated circuit device structures described herein.

FIG. 5 is a schematic view of the layout of exemplary masks used in the fabrication of n-channel HFETs during certain operations of FIGS. 3A-3L.

DETAILED DESCRIPTION OF THE PREFERRED EMBODIMENTS

Figure 1:
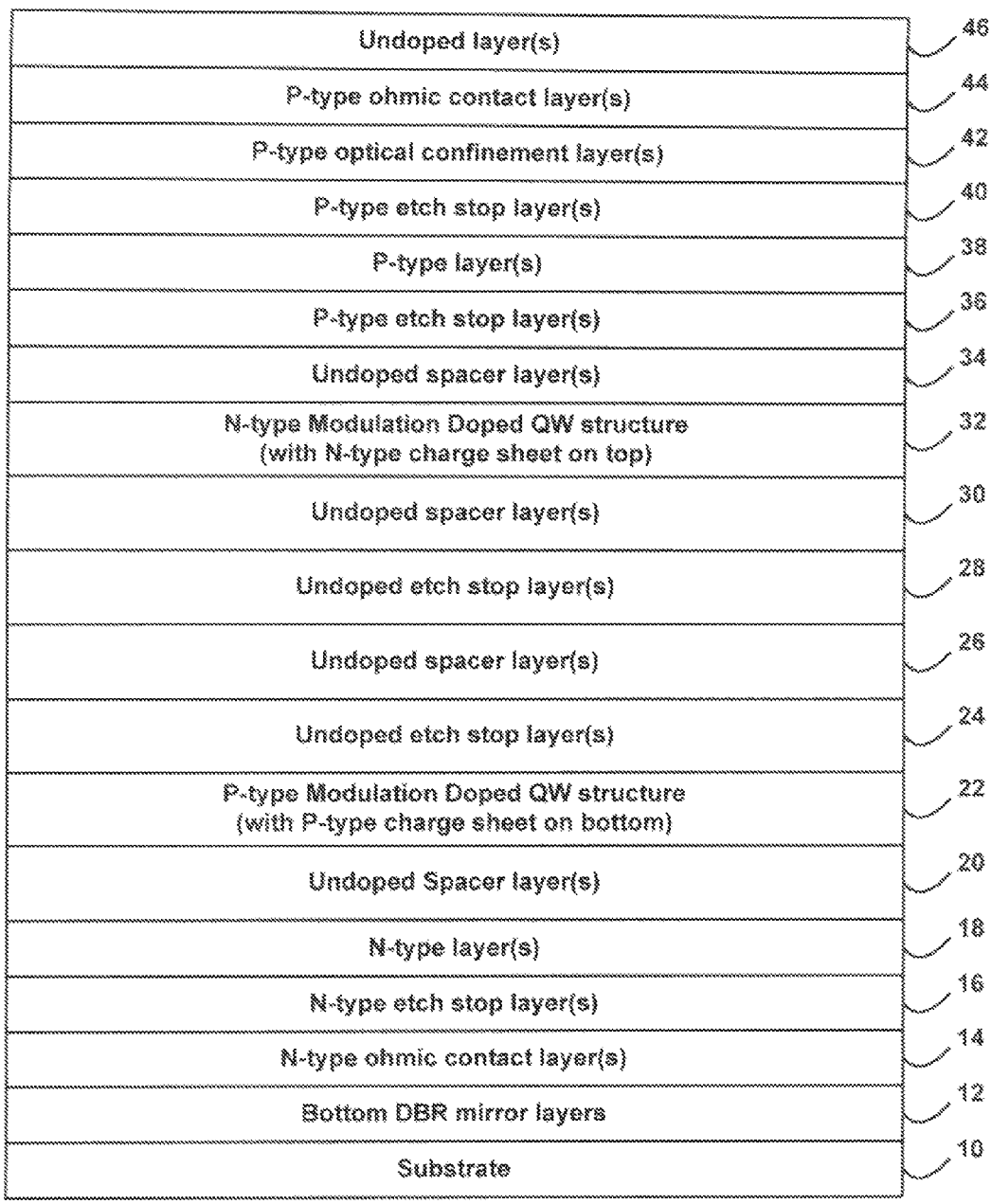
FIG. 1 is a schematic illustration of exemplary layer structures of the optoelectronic integrated circuit device structures described herein.
Figure 3A:
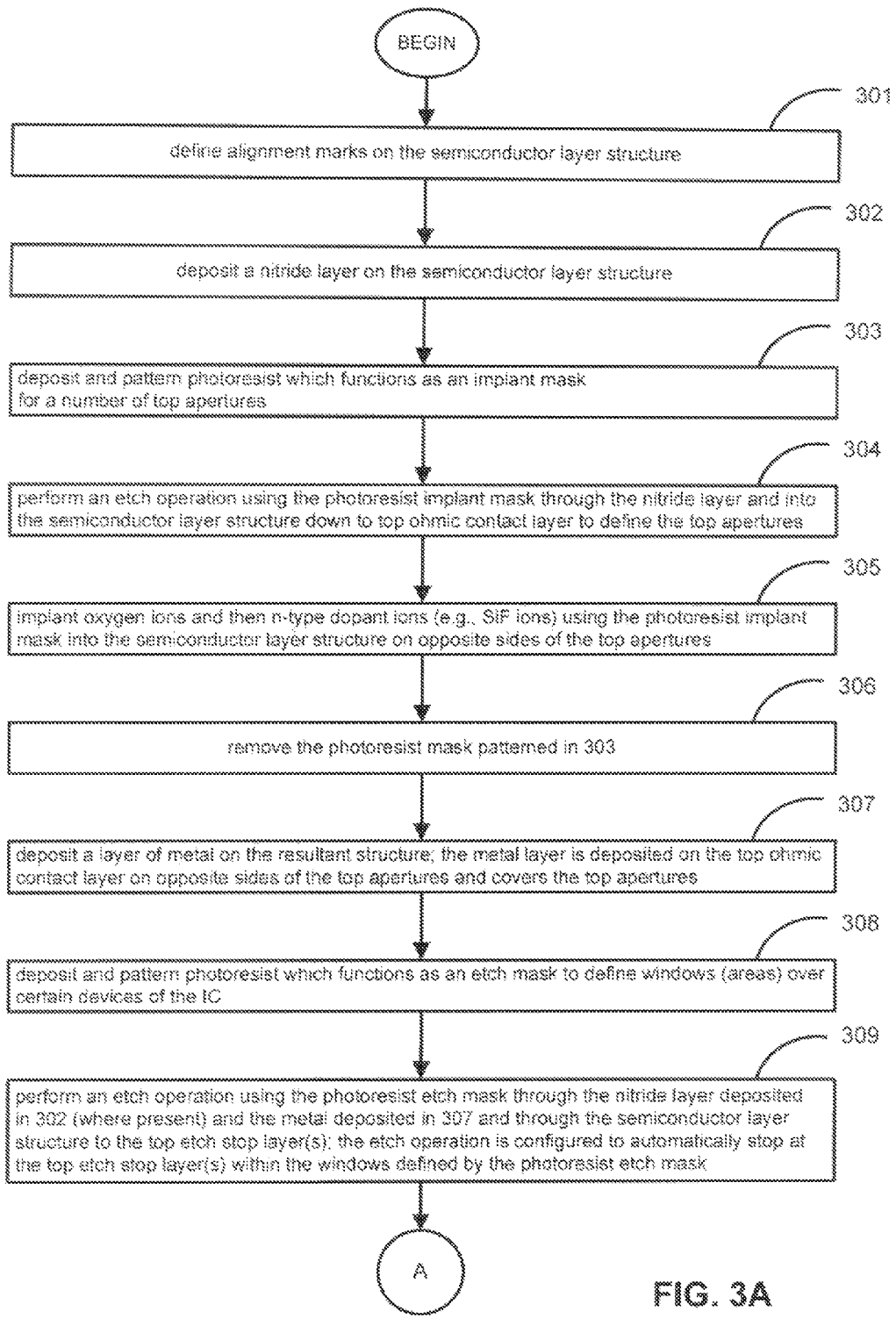
FIGS. 3A-3L, collectively, is a flow chart that illustrates exemplary fabrication steps that form optoelectronic integrated circuit device structures described herein.
Figure 3B:
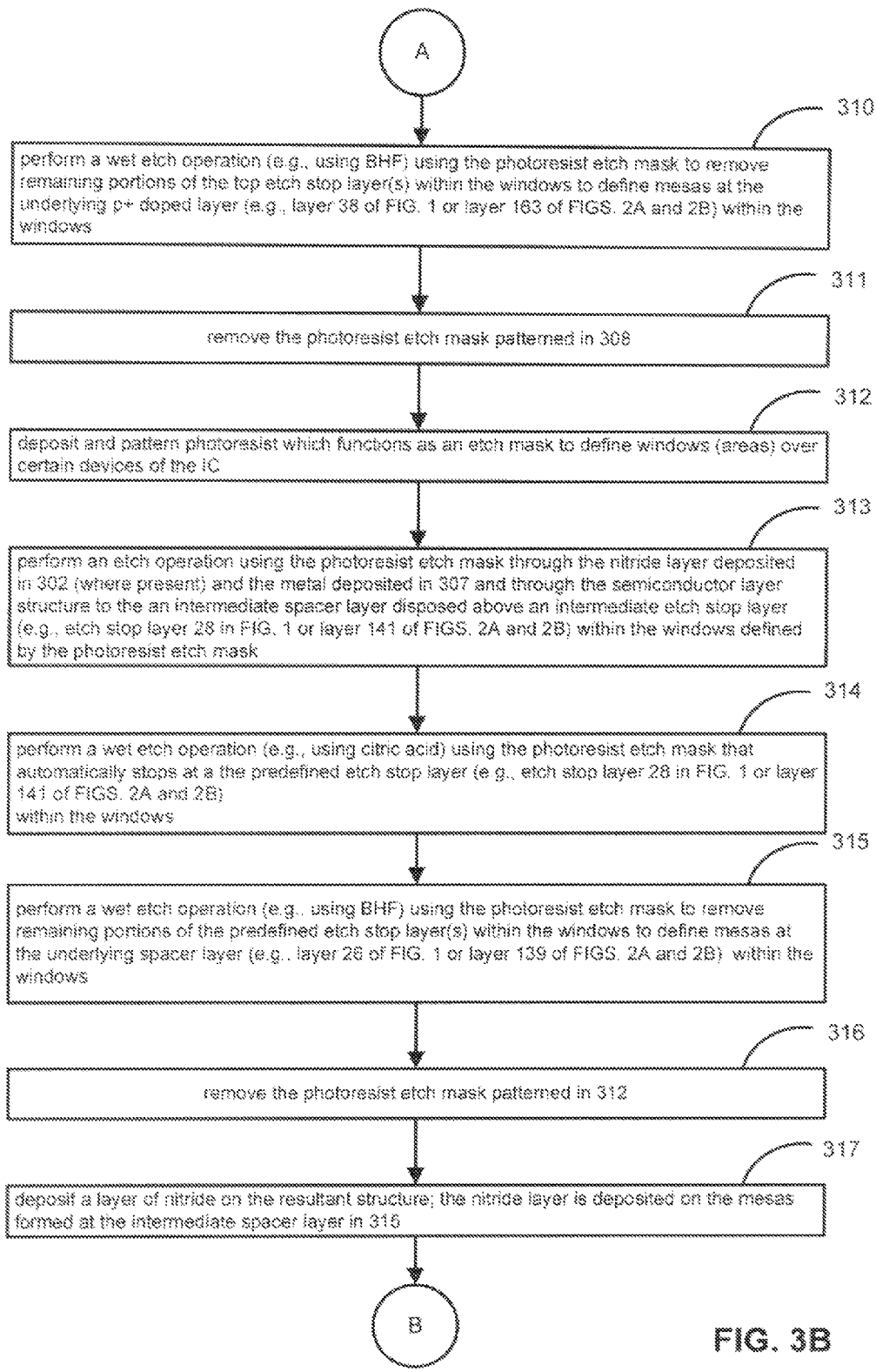
Figure 3C:
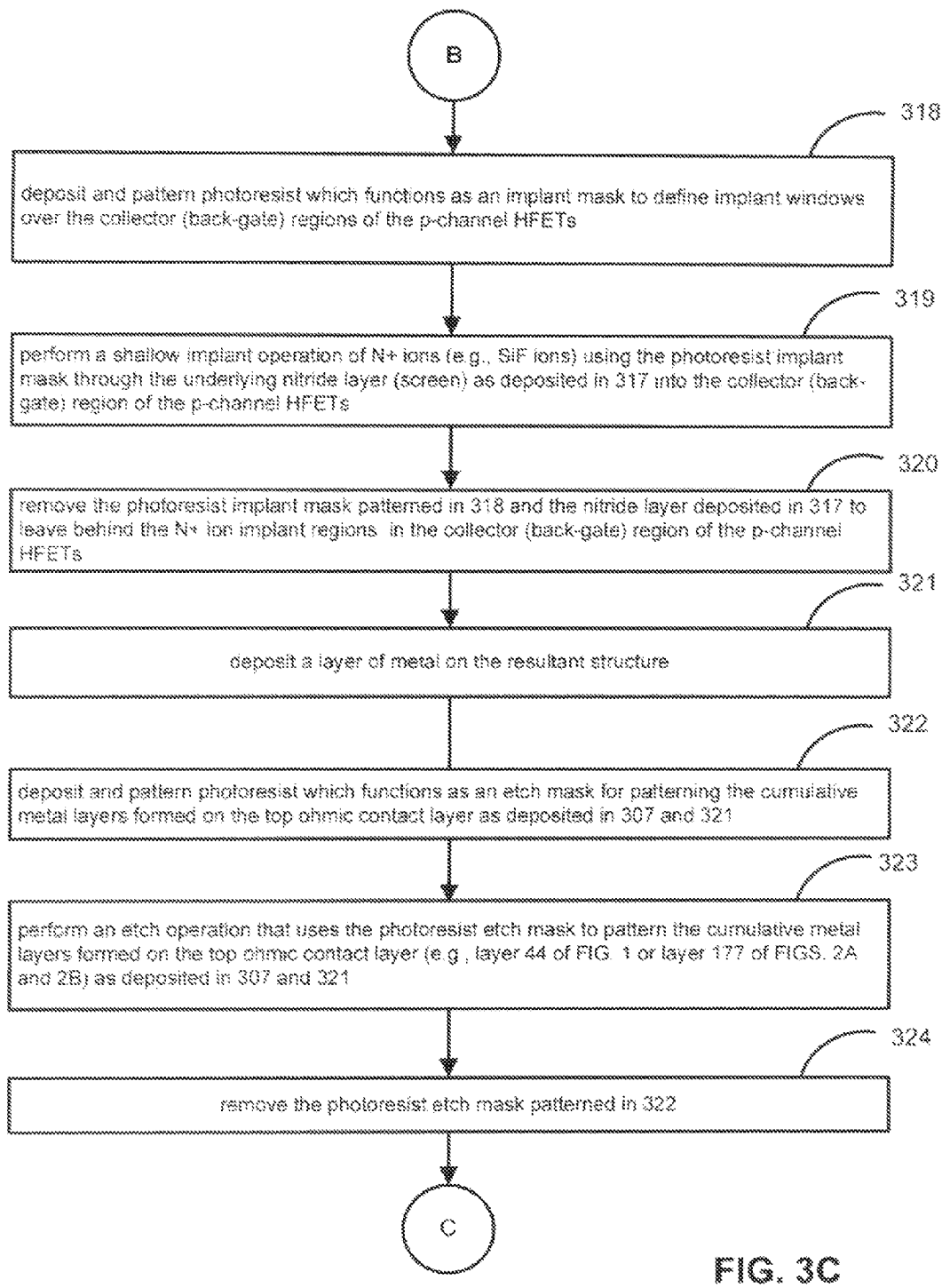
Figure 3D:
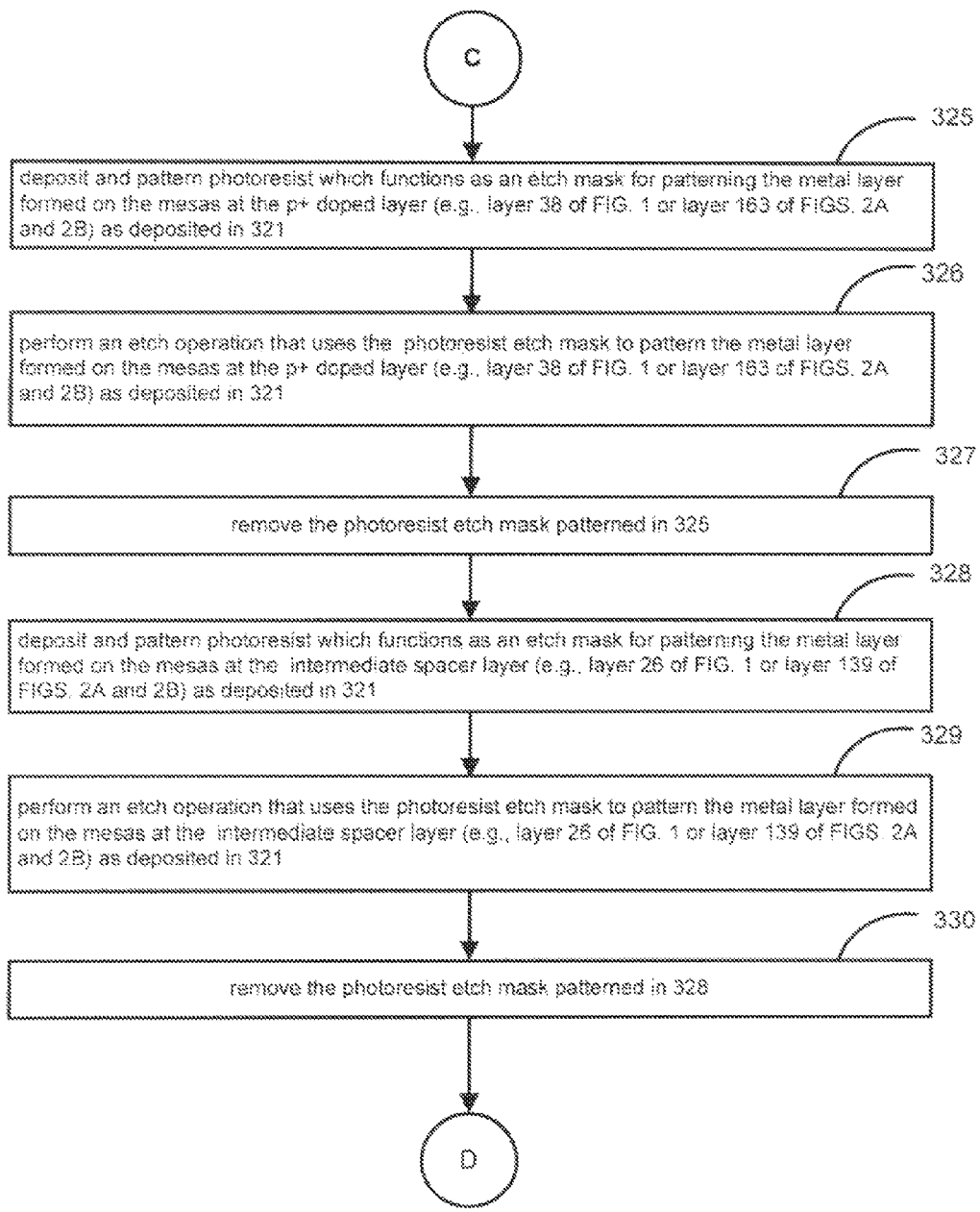
Figure 3E:
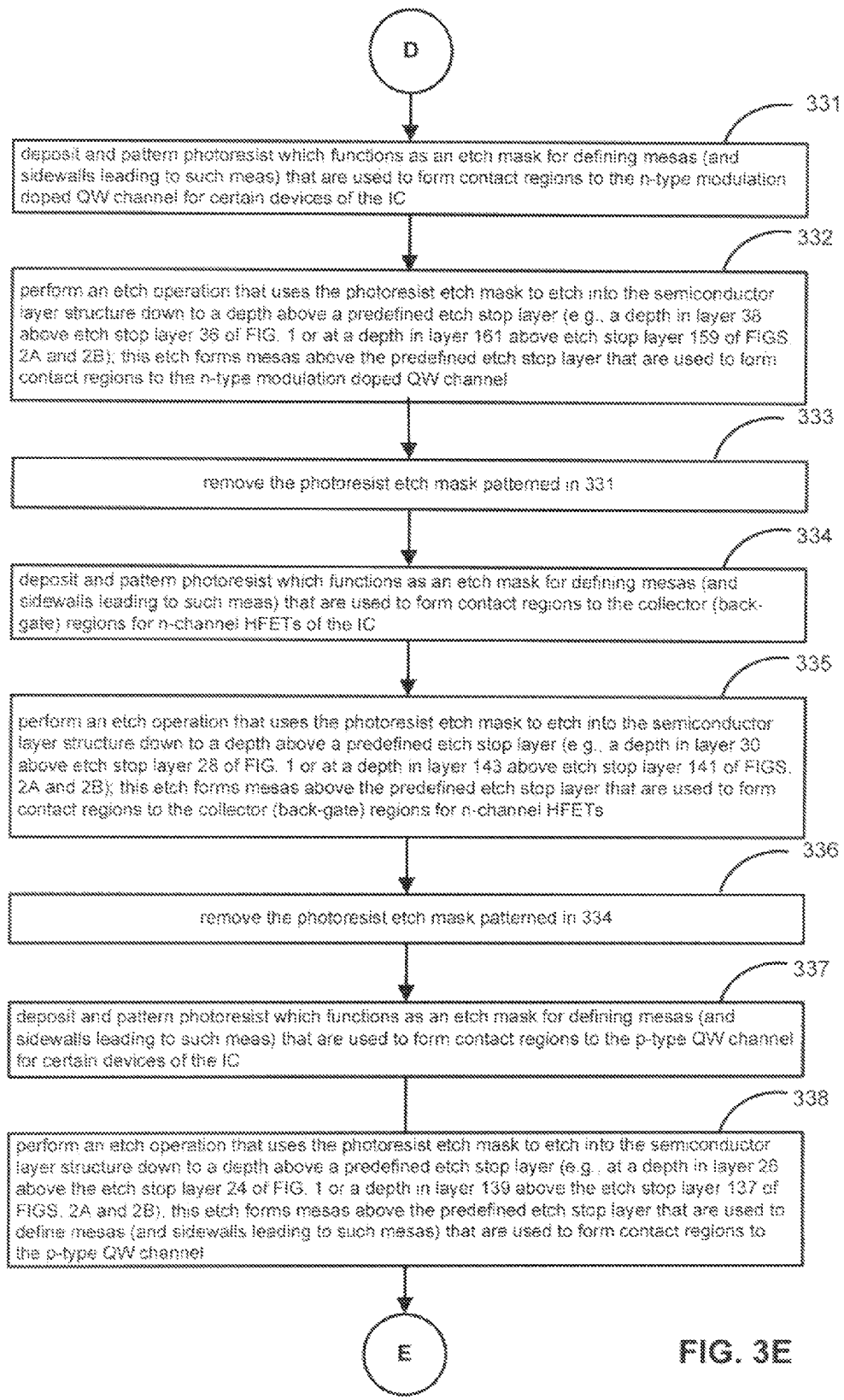
Figure 3F:
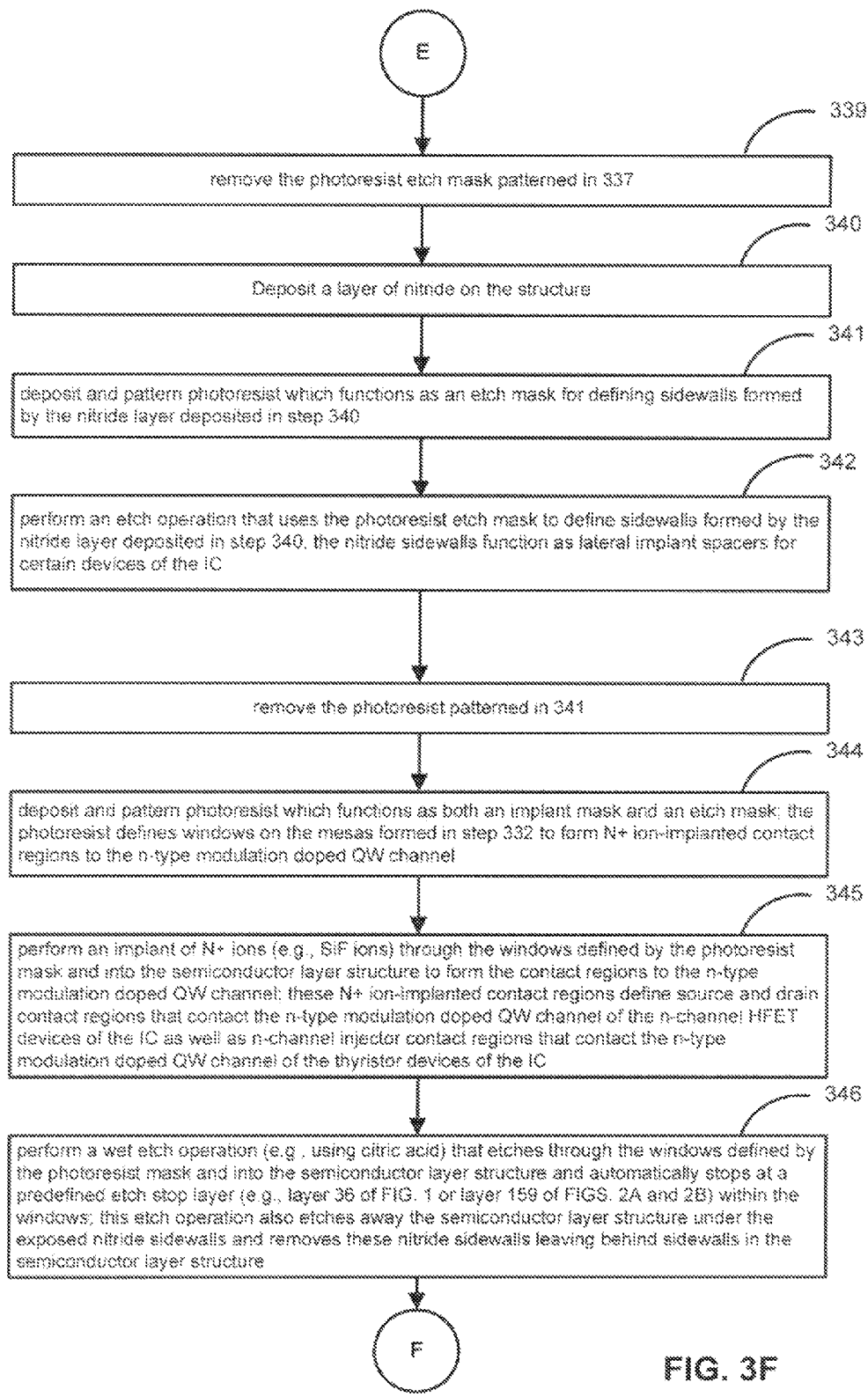
Figure 3G:
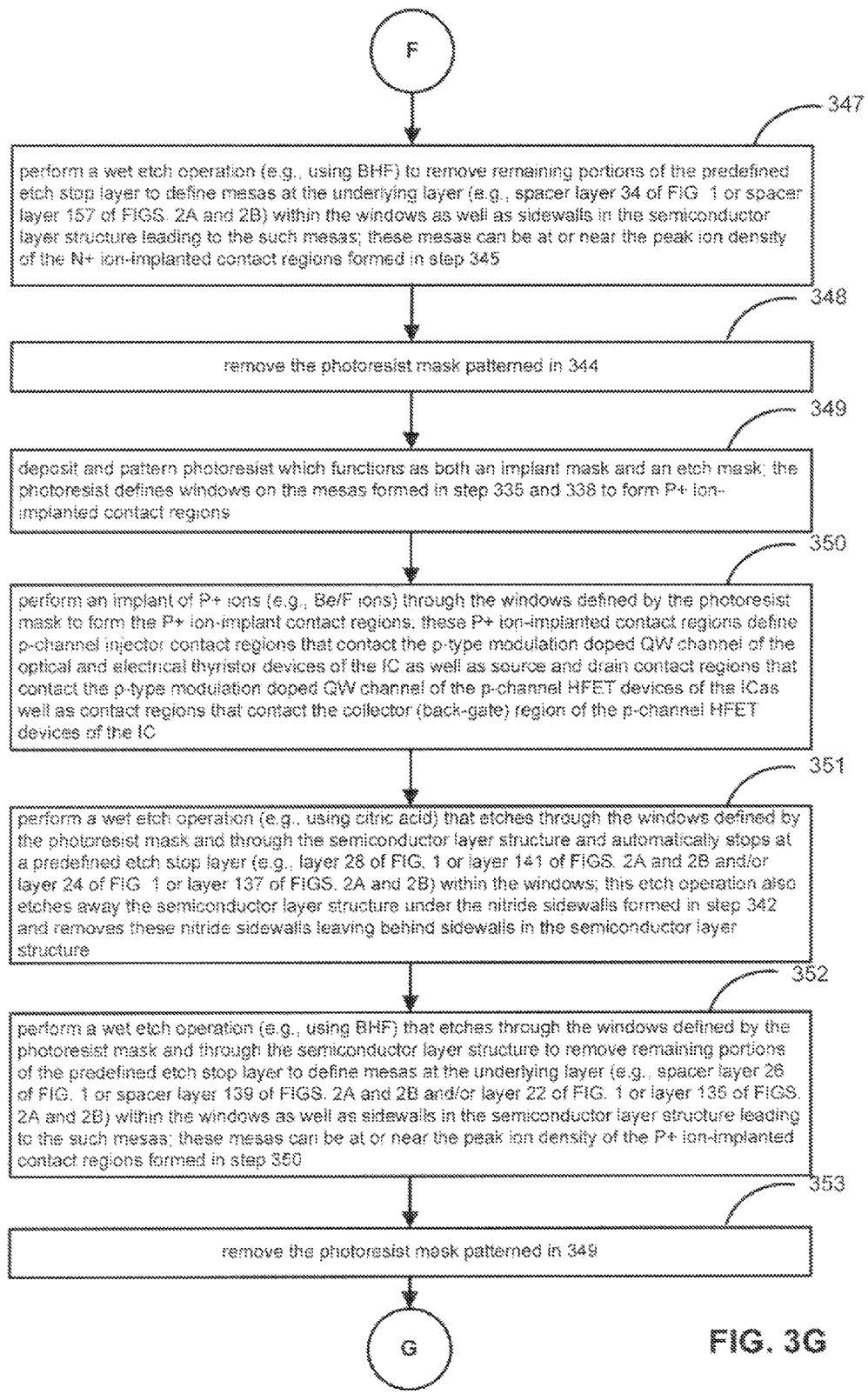
Figure 3H:
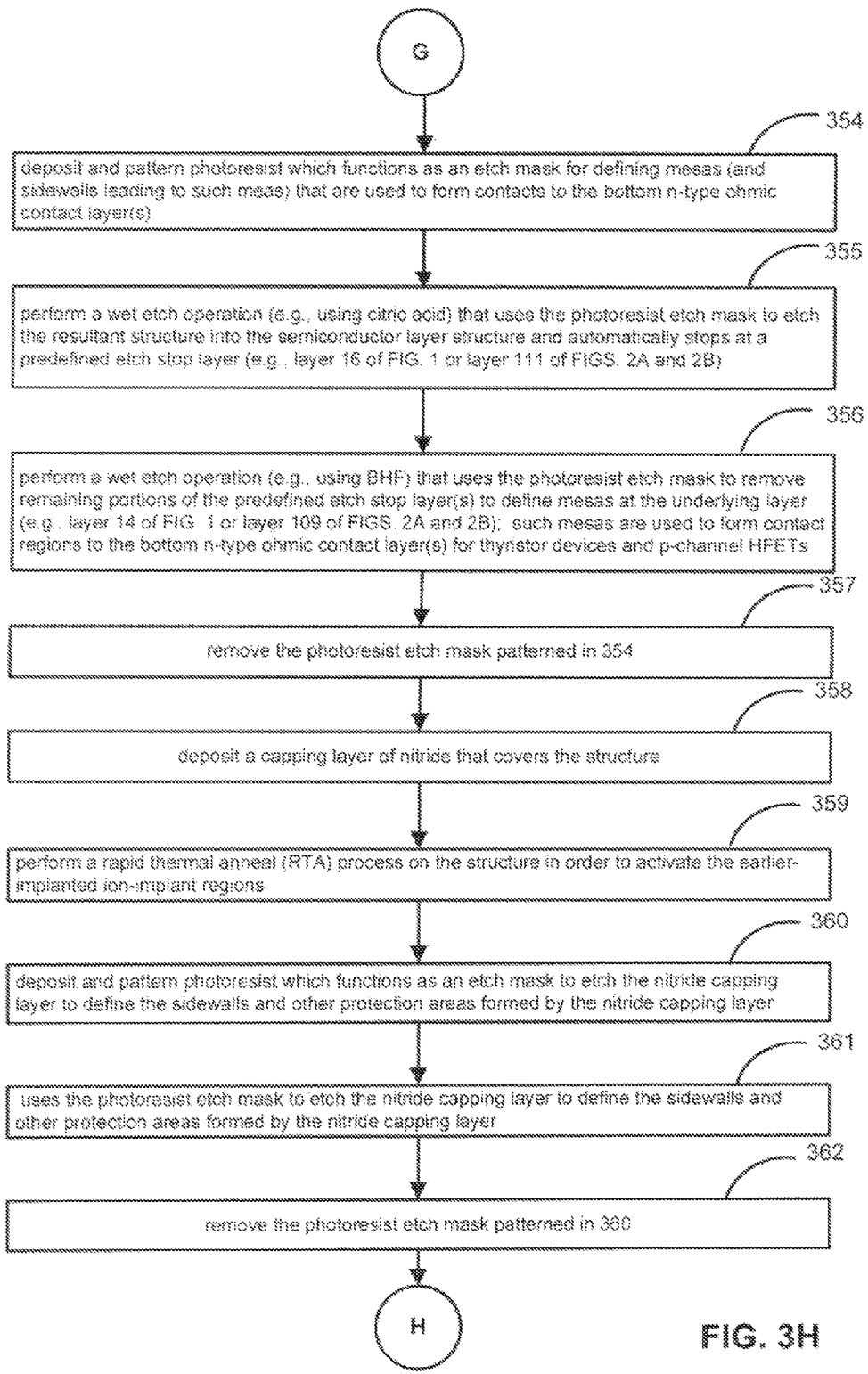
Figure 3I:
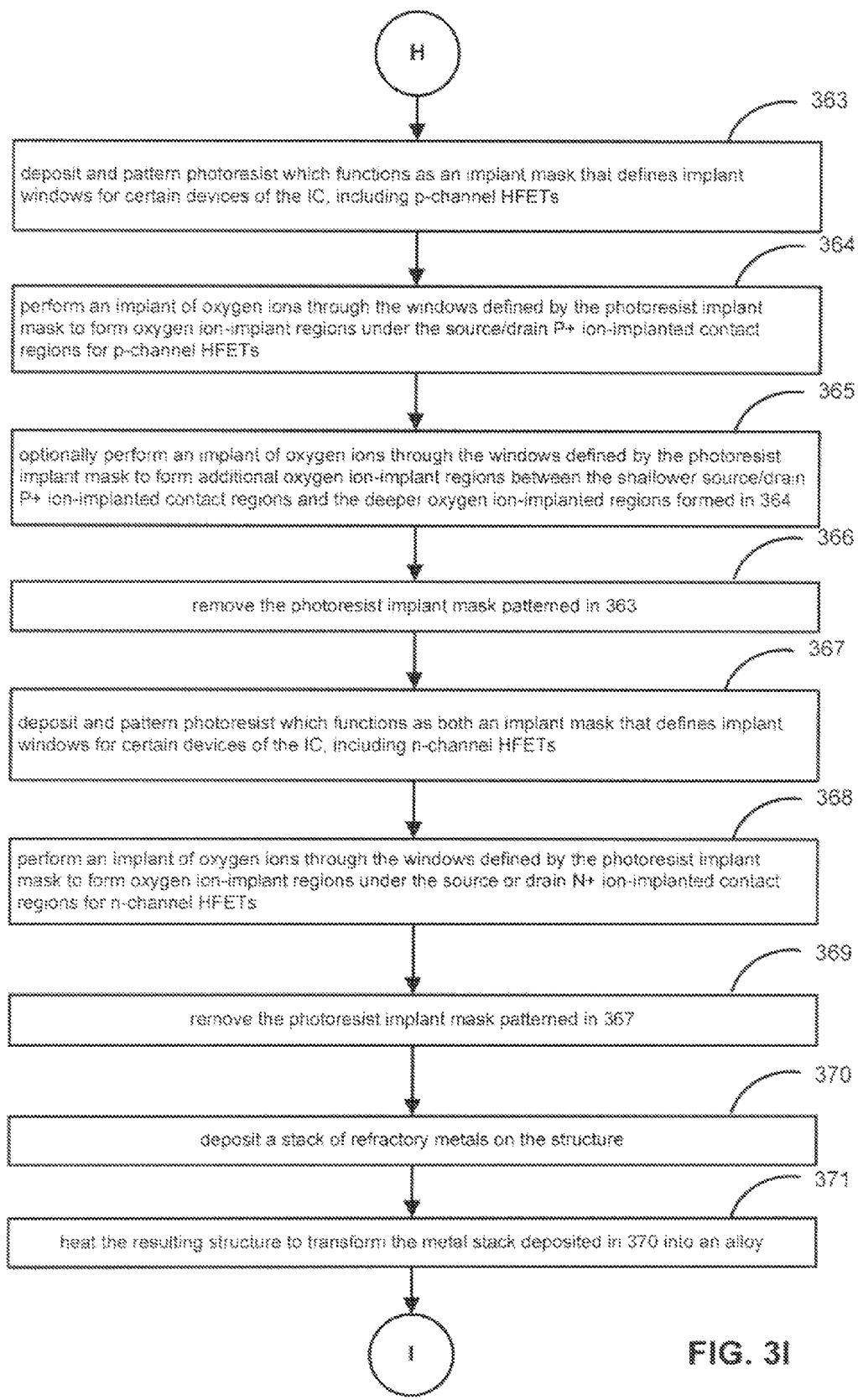
Figure 3J:
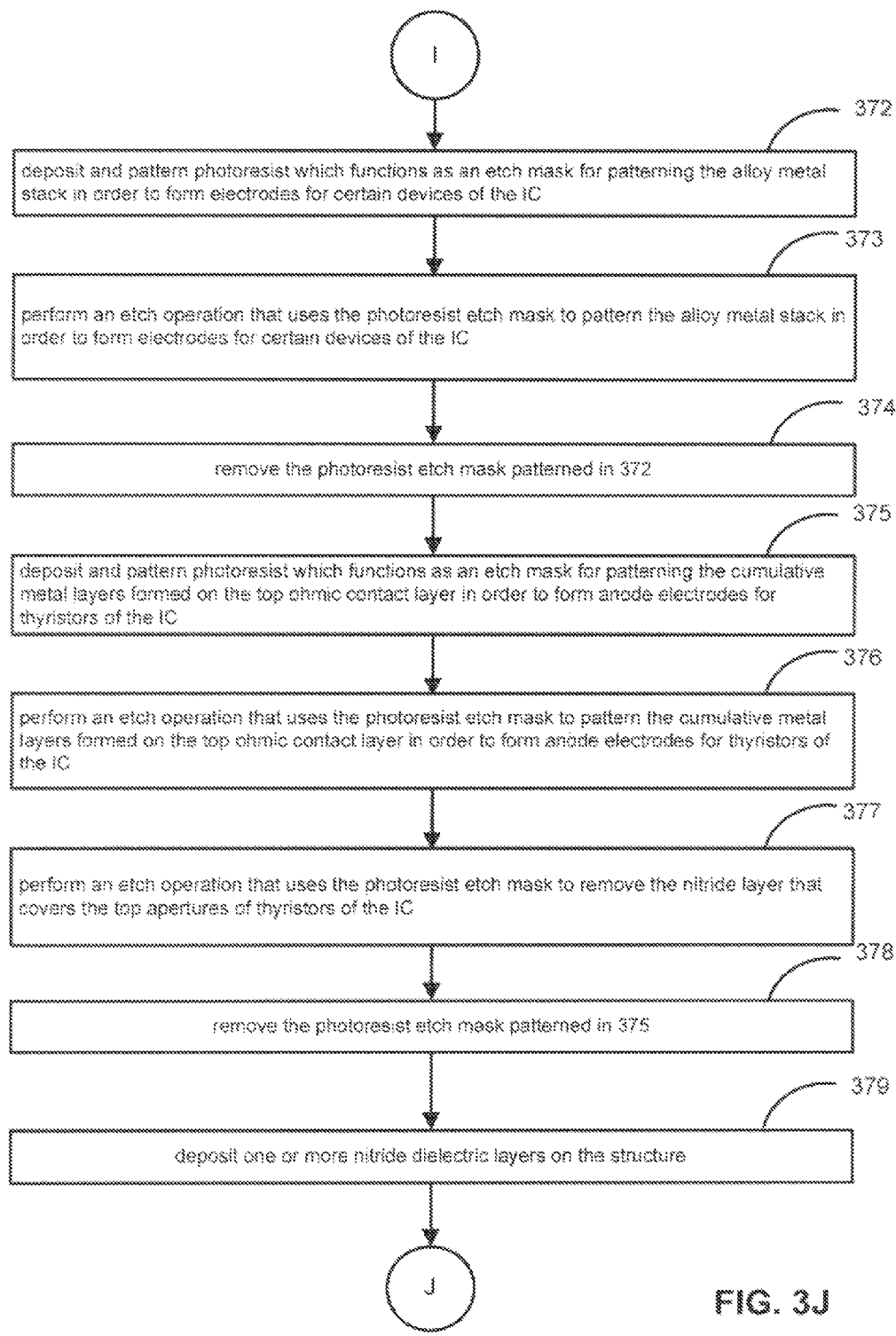
Figure 3K:
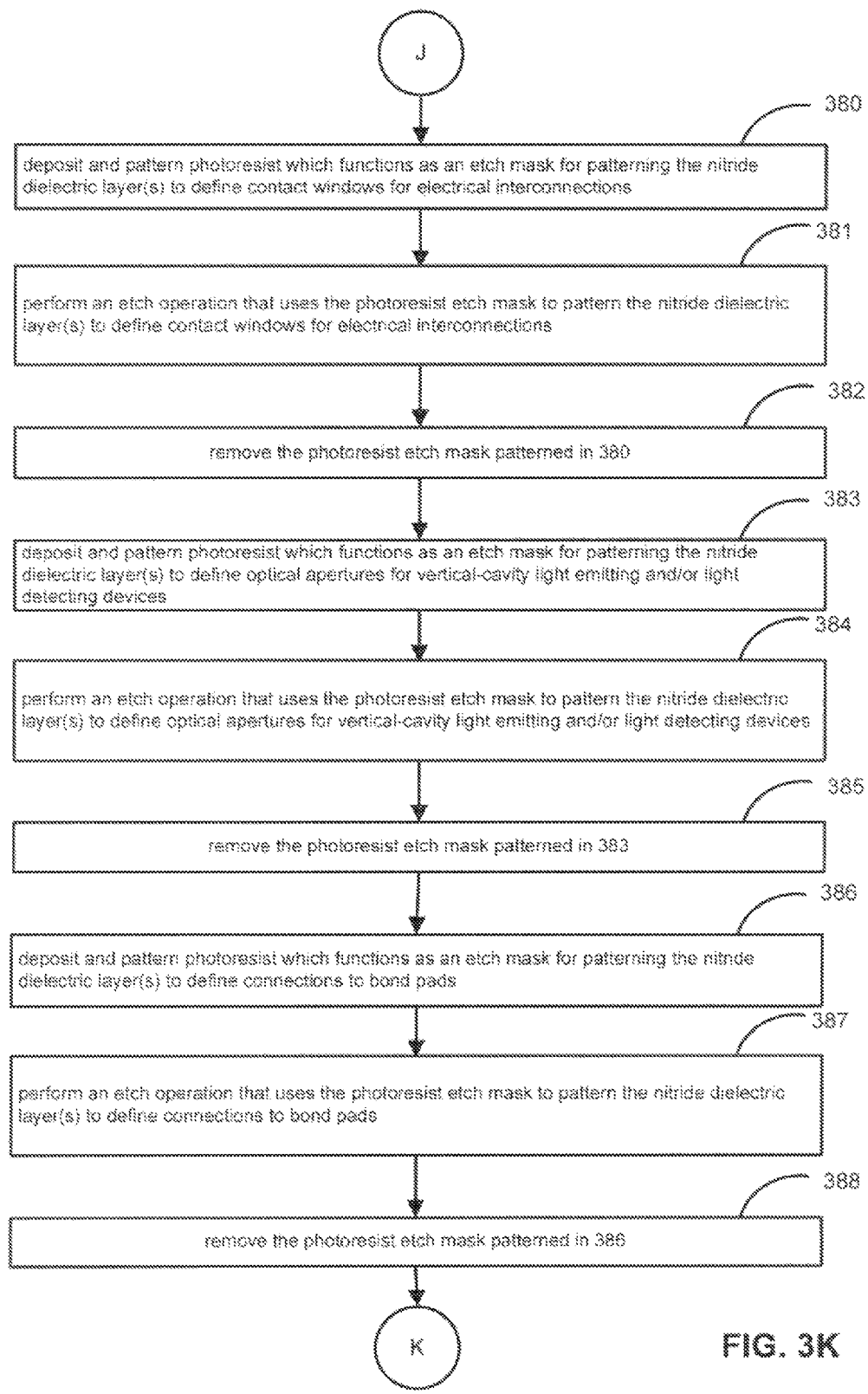
Figure 3L:
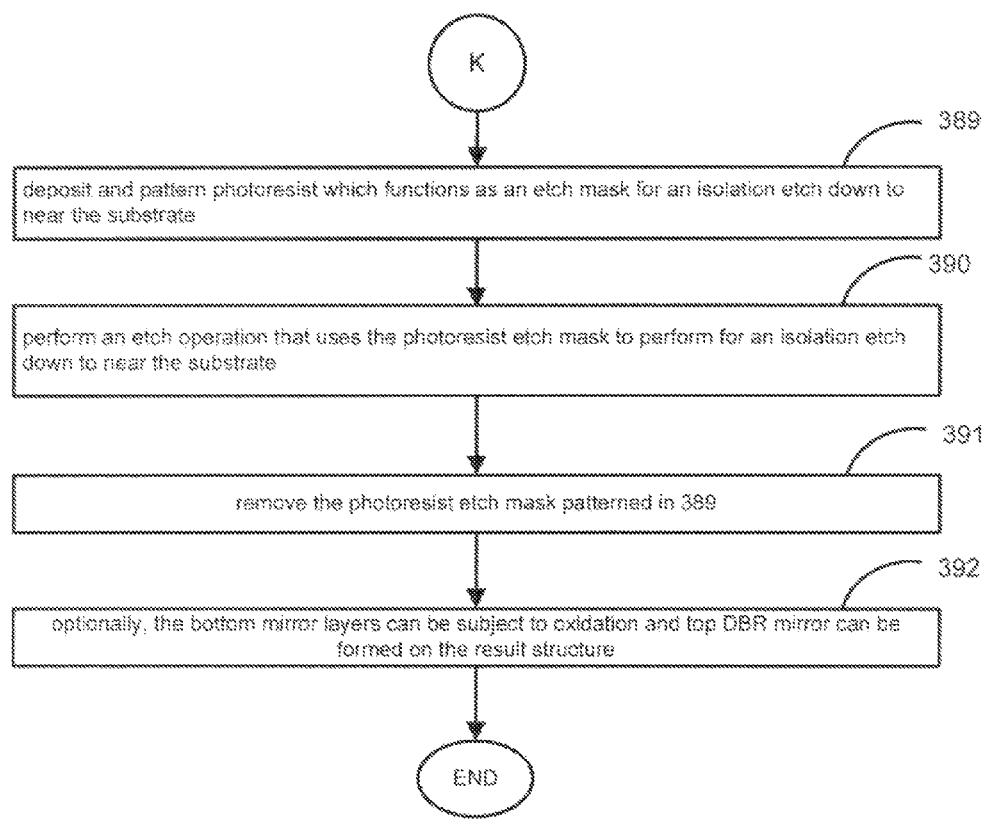

Turning now to FIG. 1, the device structure of the present application includes a bottom dielectric distributed Bragg reflector (DBR) mirror 12 formed on substrate 10. The bottom DBR mirror 12 is typically formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda$/4) optical thickness, the reflections from each of the boundaries will be added in phase to produce a large amount of reflected light (e.g., a large reflection coefficient) at the particular center wavelength $\lambda_C$. Deposited upon the bottom DBR mirror 12 is the active device structure suitable for realizing complementary heterostructure field-effect transistor (HFET) devices.

The first of these complementary HFET devices is a p-channel HFET formed above the bottom DBR mirror layers 12. The p-channel HFET includes a p-type modulation doped quantum well (QW) structure 22 with an n-type gate region (e.g., the layers encompassing the n-type ohmic contact layer 14 and the n-type layer(s) 18)) formed below the p-type modulation doped QW structure 22. The p-type modulation doped QW structure 22 includes a thin P+ doped charge sheet formed below one or more QWs with an undoped spacer layer therebetween. One or more n-type etch stop layer(s) 16 can be formed directly on the n-type ohmic contact layer 14 between the n-type ohmic contact layer 14 and the n-type layer(s) 18 as shown. An undoped spacer layer 20 can be disposed between the p-type modulation doped quantum well (QW) structure 22 and the underlying n-type gate region (n-type layer(s) 18).

A sequence of intermediate layers can be formed above the p-type modulation doped QW structure 22. The sequence of intermediate layers can include one or more undoped etch stop layers 24 formed directly on the p-type modulation doped QW structure 22, followed by one or more undoped spacer layers 26 formed above the etch stop layer(s) 24, followed by one or more undoped etch stop layers 28 formed directly on the spacer layer(s) 26, followed by one or more spacer layers 30 formed above the etch stop layer(s) 28. The spacer layer(s) 26 can include a first QD-In-QW structure (not shown), where the first QD-In-QW structure includes at least one QW layer with self-assembled quantum dots (QDs) embedded therein. The spacer layer(s) 30 can include a second QD-In-QW structure (not shown), where the second QD-In-QW structure includes at least one QW layer with self-assembled quantum dots (QDs) embedded therein.

The second of these complementary HFET devices is an n-channel HFET formed above the sequence of intermediate layers. The n-channel HFET includes an n-type modulation doped QW structure 32 with a p-type gate region (e.g., p-type layer(s) 38) formed above the n-type modulation doped QW structure 32. The n-type modulation doped QW structure 32 includes a thin N+ doped charge sheet formed above one or more QWs with an undoped spacer layer therebetween. An undoped spacer layer 34 can be disposed between the n-type modulation doped QW structure 32 and the overlying p-type gate region (p-type layer(s) 38). One or more p-type etch stop layer(s) 36 can be formed directly on the undoped spacer 34 between the n-type modulation doped QW structure 32 and the p-type gate region (layer(s) 38) as shown.

The intermediate layers encompassing the spacer layers 26 and 30 forms the collector (or back-gate) region of the p-channel HFET. Similarly, the intermediate layers encompassing the spacer layers 26 and 30 forms the collector (or back-gate) region of the n-channel HFET. Such collector (back-gate) regions are analogous to the substrate region of a MOSFET device as is well known. Therefore a non-inverted n-channel HFET device is stacked upon an inverted p-channel HFET device as part of the active device structure.

One or more additional p-type layers can be formed above the gate region (layer(s) 38) of the n-channel HFET. Such additional p-type layer(s) can include one or more p-type layers 42 followed by one or more p-type ohmic contact layers 44 formed on the p-type layers 42. One or more p-type etch stop layer(s) 40 can be formed directly on the p-type gate region (layer(s) 38) between the p-type gate region (layer(s) 38) and the additional p-type layer(s) as shown. One or more additional undoped layers 46 can be formed above the additional p-type layer(s) as shown.

The bottom n-type gate region (layers 14 and 18) and p-type modulation doped QW structure 22 of the p-channel HFET together with the n-type modulation doped QW structure 32 and p-type gate region (layer(s) 38) of the n-channel HFET define a vertical thyristor (N-P-N-P) device structure. The top p-type layer(s) 42, 44 of the active device structure also form part of the top P-type region of the vertical thyristor (N-P-N-P) device structure. The vertical thyristor (N-P-N-P) device structure can be used to define an optical thyristor device or electrical thyristor device as needed.

The n-type etch stop layer(s) 16 can be used to automatically stop etching at or near the top of the n-type ohmic contact layer(s) 14, which facilitates forming electrical contact to the n-type ohmic contact layer(s) 14 as needed.

The undoped etch stop layer(s) 24 can be used to automatically stop etching at or near the top of the p-type modulation doped quantum well structure 22, which facilitates forming electrical contact to the p-type modulation doped quantum well structure 22 as needed.

The undoped etch stop layer(s) 28 can be used to automatically stop etching at or near the top of the intermediate spacer layer 26, which facilitates forming electrical contact to the intermediate spacer layer 26 as needed.

The p-type etch stop layer(s) 36 can be used to automatically stop etching at or near the top of the undoped spacer layer 34, which facilitates forming electrical contact to the n-type modulation doped quantum well structure 32 as needed.

The p-type etch stop layer(s) 40 can be used to automatically stop etching at or near the top of the p-type gate region (layer(s) 38) of the n-channel HFET, which facilitates forming electrical contact to the p-type gate region (layer(s) 38) of the n-channel HFET as needed.

The active device layer structure begins with n-type ohmic contact layer(s) 14 which enables the formation of ohmic contacts thereto. N-type etch stop layer(s) 16 can be deposited on layer(s) 14. The n-type etch stop layer(s) 16 facilitates forming electrical contact to the underlying n-type ohmic contact layer(s) 14 as needed. Deposited on layer(s) 16 are one or more n-type layers 18 and an undoped spacer layer 20 which serve electrically as part of the gate of the p-channel HFET device and bottom n-type region of the vertical thyristor (N-P-N-P) device and optically as a part of the lower waveguide cladding of the optical thyristor device. The p-type modulation doped QW structure 22 is deposited on layer 20. The p-type modulation doped QW structure 22 includes a thin P+ doped charge sheet offset from one or more QWs (which may be formed from strained or unstrained heterojunction materials) by an undoped spacer layer. The P+ doped charge sheet is formed first below the undoped spacer and the one or more QWs of the p-type modulation doped QW structure 22. The p-type modulation doped QW structure 22 serves electrically as part of the channel of the p-channel HFET device and the intermediate p-type region of the vertical thyristor (N-P-N-P) device. All of the layers grown thus far form the p-channel HFET device with the gate ohmic contact on the bottom. Undoped etch stop layer(s) 24 can be deposited on the p-type modulation doped QW structure 22. The etch stop layer(s) 24 facilitates forming electrical contact to the underlying p-type modulation doped QW structure 22.

An undoped spacer layer 26 can be formed on the etch stop layer(s) 24, which functions electrically as a collector (back-gate) region for the inverted p-channel HFET as well as part of the collector (back-gate) region for the n-channel HFET. The spacer layer 26 can include a first QD-In-QW structure (not shown) that corresponds to the p-type modulation doped QW structure 22. Undoped etch stop layer(s) 28 can be deposited on the spacer layer 26. The etch stop layer(s) 28 facilitates forming electrical contact to the underlying spacer layer 26 as needed.

An undoped spacer layer 30 can be formed on the etch stop layer(s) 28, which functions electrically as another part of the collector (back-gate) region for the n-channel HFET. The spacer layer 30 can include a second QD-In-QW structure (not shown) that corresponds to the n-type modulation doped QW structure 32.

The n-type modulation doped QW structure 32 is deposited on the spacer layer 30. The n-type modulation doped QW structure 32 includes a thin N+ doped n-type charge sheet offset from one or more QWs by an undoped spacer layer. The n-type charge sheet is formed last above the undoped spacer and the one or more QWs of the n-type modulation doped QW structure 32. The n-type modulation doped QW structure 32 serves electrically as part of the channel of the n-channel HFET device and the intermediate n-type region of the vertical thyristor (N-P-N-P) device.

Undoped spacer layer(s) 34 can be deposited on the n-type modulation doped QW structure 32, which functions electrically as part of the gate for the n-channel HFET. P-type etch stop layer(s) 36 can be deposited on the spacer layer(s) 34. The etch stop layer(s) 36 facilitates forming electrical contact to the underlying n-type modulation doped QW structure 32.

P-type layer(s) 38 can be deposited on the etch stop layers 36, which function electrically as part of the gate for the n-channel HFET as well as part of the top p-type region for the vertical thyristor (N-P-N-P) device. In one embodiment, the p-type layer(s) 38 includes a thin layer of highly p-doped material (such as P+ doped GaAs) formed on top of a thicker layer of highly p-doped material (such as P+ doped AlGaAs). In this configuration, the thin P+ layer achieves low gate contact resistance and the thicker P+ layer defines the capacitance of the n-channel HFET with respect to the n-type modulation doped QW structure 32. P-type etch stop layer(s) 40 can be deposited on the p-type layer(s) 38. The etch stop layer(s) 40 facilitates forming electrical contact to the underlying p-type layer(s) 38.

One or more p-type layers 42 can be deposited on the etch stop layer(s) 40, which function electrically as part of the top p-type region of the vertical thyristor (N-P-N-P) device and optically as part of the upper waveguide cladding of optical vertical thyristor device. Deposited on p-type layer(s) 42 is one or more p-type ohmic contact layer(s) 44, which enables the formation of ohmic contacts thereto. One or more additional undoped layers 46 can be formed above the additional p-type layer(s) as shown.

For the n-channel HFET device, the gate region (layer(s) 38) is exposed by etching away the layers that overlie the gate region, and a gate terminal electrode of the n-channel HFET device is formed on the gate region. The p-type etch stop layer(s) 40 can be used to automatically stop etching at or near the top of the p-type gate region (layer(s) 38) of the n-channel HFET, which facilitates forming electrical contact between the gate terminal electrode and the p-type gate region (layer(s) 38) of the n-channel HFET device. A source terminal electrode and a drain terminal electrode of the n-channel HFET device are operably coupled via n-type ion implanted contact regions to opposite ends of a QW channel(s) realized in the n-type modulation doped QW structure 32. The p-type etch stop layer(s) 36 can be used to automatically stop etching at or near the top of the spacer layer(s) 34, which facilitates implant operations of n-type ions to form the n-type ion implanted contact regions as well as forming electrical contact between the source and drain terminal electrodes and the opposite ends of a QW channel(s) realized in the n-type modulation doped QW structure 32 for the n-channel HFET device. One or more terminal electrodes (not shown) can be operably coupled (for example, via p-type ion implant regions) to the intermediate spacer layer(s) 26 and used as collector (back-gate) terminal electrodes for the n-channel HFET device.

For the p-channel HFET device, the collector (back-gate) region (spacer layer(s) 26) is exposed by etching away the layers that overlie the collector (back-gate) region. A shallow P+ type ion implant contact region can be implanted into the collector (back-gate) region. A collector (back-gate) terminal electrode can be formed on the collector (back-gate) region of the p-channel HFET device. The etch stop layer(s) 28 can be used to automatically stop etching at or near the top of the collector (back-gate) region of the n-channel HFET, which facilitates implant operations of p-type ions to form the p-type ion implanted contact region as well as forming electrical contact between the collector (back-gate) terminal electrode and the collector (back-gate) region of the p-channel HFET device. A source terminal electrode and a drain terminal electrode of the p-channel HFET device are operably coupled via p-type ion implanted contact regions to opposite ends of a QW channel(s) realized in the p-type modulation doped QW structure 22. The etch stop layer(s) 24 can be used to automatically stop etching at or near the top of the p-type modulation doped QW structure 22, which facilitates implant operations of p-type ions to form the p-type ion implanted contact regions as well as forming electrical contact between the source and drain terminal electrodes and the opposite ends of a QW channel(s) realized in the p-type modulation doped QW structure 22 for the p-channel HFET device. The gate region (n-type ohmic contact layer 14) of the p-channel HFET device is exposed by etching away the layers that overlie the gate region. A gate electrode is formed on the bottom n-type ohmic contact layer 14 for the p-channel HFET device.

Both the n-channel HFET device and the p-channel HFET device are field effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation doped QW structure 32 between the source terminal electrode and the drain terminal electrode. In this configuration, the source terminal electrode is the terminal electrode from which the electron carriers enter the QW channel of the n-type modulation doped QW structure 32, the drain terminal electrode is the terminal electrode where the electron carriers leave the device, and the gate terminal electrode is the control terminal for the device.

The p-channel HFET device operates in a similar manner to the n-channel HFET device with the current direction and voltage polarities reversed with respect to those of the n-channel HFET device. For the p-channel HFET device, the QW channel conductance is turned on by biasing the gate terminal electrode and the source terminal electrode at a voltage where the P/N junction of the source and gate regions is forward-biased with minimal gate conduction and an inversion layer of hole gas is created in the QW channel of the p-type modulation doped QW structure 22 between the source terminal electrode and the drain terminal electrode. In this configuration, the source terminal electrode is the terminal from which the hole carriers enter the QW channel of the p-type modulation doped QW structure 22, the drain terminal electrode is the terminal where the hole carriers leave the device, and the gate terminal electrode is the control terminal for the device.

The n-channel HFET can also be configured to operate as a phototransistor where current flows as a two-dimensional gas through the QW channel region of the n-type modulation doped QW structure 32 of the active waveguide region with the source and drain terminal electrodes on either side of the QW channel region. The basic transistor action is the modulation of the QW channel conductance by an inversion layer (i.e., a two-dimensional electron gas) that is produced by the absorption of the optical mode propagating within the active waveguide region of the phototransistor. In this case, the gate terminal electrode can be omitted. Specifically, the QW channel conductance is controlled by the absorption of the optical mode propagating within the active waveguide region of the phototransistor, which produces an inversion layer of electron gas in the QW channel of the n-type modulation doped quantum well structure 32 between the source terminal electrode and the drain terminal electrode. This inversion layer provides a source-drain current path that allows for the conduction of current between the source terminal electrode and the drain terminal electrode. In other words, the source-drain current path of the phototransistor device is in its conducting ON state. Without the presence of the inversion, there is no source-drain current path that allows for the conduction of current between the source terminal electrode and the drain terminal electrode. In other words, the source-drain current path of the phototransistor is in its non-conducting OFF state. In this configuration, the source terminal electrode is the terminal electrode from which the electron carriers enter the QW channel of the n-type modulation doped QW structure 32, and the drain terminal electrode is the terminal electrode where the electron carriers leave the device.

The p-channel HFET can also be configured to operate as a phototransistor where current flows as a two-dimensional gas through the QW channel region of the p-type modulation doped QW structure 22 of the active waveguide region with the source and drain terminal electrodes on either side of the QW channel region. The basic transistor action is the modulation of the QW channel conductance by an inversion layer (i.e., a two-dimensional hole gas) that is produced by the absorption of the optical mode propagating within the active waveguide region of the phototransistor. In this case, the gate terminal electrode can be omitted. Specifically, the QW channel conductance is controlled by the absorption of the optical mode propagating within the active waveguide region of the phototransistor, which produces an inversion layer of hole gas in the QW channel of the p-type modulation doped quantum well structure 32 between the source terminal electrode and the drain terminal electrode. This inversion layer provides a source-drain current path that allows for the conduction of current between the source terminal electrode and the drain terminal electrode. In other words, the source-drain current path of the phototransistor device is in its conducting ON state. Without the presence of the inversion, there is no source-drain current path that allows for the conduction of current between the source terminal electrode and the drain terminal electrode. In other words, the source-drain current path of the phototransistor is in its non-conducting OFF state. In this configuration, the source terminal electrode is the terminal electrode from which the hole carriers enter the QW channel of the p-type modulation doped QW structure 22, and the drain terminal electrode is the terminal electrode where the hole carriers leave the device.

The device structure of the present application can also be configured to realize bipolar inversion channel field-effect transistors (BICFETs) with either an n-type modulation doped quantum well inversion channel base region (n-channel base BICFET) or a p-type modulation doped quantum well inversion channel base region (p-channel base BICFET).

For the n-channel base BICFET device, an emitter terminal electrode of the n-channel base BICFET device is operably coupled to the top p-type ohmic contact layer(s) 44 (or the p-type layers 38) of the active device structure. A base terminal electrode of the n-channel base BICFET device is operably coupled to the QW channel(s) realized in the n-type modulation doped QW structure 32. A collector terminal electrode of the n-channel base BICFET device is operably coupled to the p-type modulation doped QW structure 22. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode.

The p-channel base BICFET device is similar in construction to the p-channel HFET device with the following adaptations. An emitter terminal electrode of the p-channel base BICFET device interfaces to the bottom n-type ohmic contact layer(s) 14 of the active device structure. A base terminal electrode of the p-channel base BICFET device is operably coupled to the QW channel region realized in the p-type modulation doped QW structure 22. A collector terminal electrode of the p-channel base BICFET device is operably coupled to the QW channel region realized in the n-type modulation doped QW structure 32. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode.

The active device structure can also be configured to realize a variety of electrical and optoelectronic thyristor devices having a vertical P-N-P-N thyristor structure. The upper p-type region (i.e., the first P) of the vertical P-N-P-N thyristor structure is formed by the p-type layers 38, 40, 42 and 44 of the active device structure. The upper n-type region (i.e., the first N) of the vertical P-N-P-N thyristor structure is formed from the n-type modulation doped QW structure 32 of the active device structure. The lower p-type region (i.e., the second P) of the vertical P-N-P-N thyristor structure is formed from the p-type modulation doped QW structure 22 of the active device structure. The lower n-type region (i.e., the second N) of the vertical P-N-P-N thyristor structure is formed by the bottom n-type layers 14, 16 and 18 of the active device structure.

The device structure of the present application can also be configured to realize optoelectronic devices such as an electrically-pumped laser or optical detector. To form a resonant cavity device for optical signal emission and/or detection, a top mirror can be formed over the active device structure described above. The top mirror can be formed by depositing pairs of semiconductor or dielectric materials with different refractive indices.

In one configuration, the resonant cavity of the device can be configured as a vertical cavity and light may enter and exit the vertical cavity through an optical aperture (not shown) in the top surface of the device such that the device operates as a vertical cavity surface emitting laser/detector. In this configuration, the distance between the top mirror and the bottom DBR mirror 12 represents the length of the optical cavity and can be set to correspond to the designated wavelength (such as 1 to 3 times the designated wavelength). This distance can take into account the penetration depth of the light into the bottom and top mirror. This distance is controlled by adjusting the thickness of one or more of the layers therebetween to enable this condition.

In another configuration, the resonant cavity of the device can be configured as a whispering gallery or closed-loop microresonator to support propagation of an optical mode signal within a waveguide region formed from the device structure. For the whispering gallery microresonator, the waveguide region can be a disk-like structure that supports propagation of a whispering gallery mode. The geometry of the disk-like structure is tuned to the particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. For the closed-loop microresonator, the waveguide can support circulating propagation of an optical mode that follows a circular optical path, a rectangular optical path, an oval optical path, or other suitable geometry. The optical path length of the closed-loop waveguide is tuned to the particular wavelength of the optical mode signal that is to propagate in the closed-loop waveguide. At least one coupling waveguide is formed integral to and adjacent the whispering gallery or closed-loop microresonator. The coupling waveguide provides for evanescent coupling of light to and/or from the whispering gallery or closed-loop microresonator. Specifically, for the laser, the whispering gallery mode produced by the whispering gallery microresonator or the optical mode signal that circulates in the closed-loop waveguide of the closed-loop microresonator is coupled to the coupling waveguide to produce an output optical signal that propagates in the coupling waveguide for output therefrom. For the detector, an input optical light is supplied to the coupling waveguide, which couples the input optical light as a whispering gallery mode in the whispering gallery microresonator for detection or as an optical mode signal that circulates in the closed-loop waveguide of the closed-loop microresonator for detection.

In the vertical cavity surface emitting laser/detector as well as the whispering gallery and closed-loop microresonators, at least one anode terminal electrode can be operably coupled to the top p-type contact layer 44, a bottom cathode terminal electrode can be operably coupled to the bottom n-type contact layer 14, an n-channel injector terminal can be operably coupled to the n-type modulation doped QW structure 32. A p-channel injector terminal can also be operably coupled to the p-type modulation doped QW structure 22. Electrically, this configuration operates as an electrically-pumped thyristor laser or thyristor detector.

For the thyristor laser, the device structure switches from a non-conducting/OFF state (where the current I through the device is substantially zero) to a conducting/ON state (where current I is substantially greater than zero) when i) the anode terminal electrode is forward biased with respect to the cathode terminal electrode and ii) the voltage between n-channel injector and the anode electrode is biased such that charge is produced in the n-type modulation doped QW structure 32 that is greater than the critical switching charge $Q_{CR}$, which is that charge that reduces the forward breakdown voltage such that no off state bias point exists. The voltage between p-channel injector electrode and cathode electrode can also be configured to produce a charge in the p-type modulation doped QW structure 22 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 32 (or the charge in the p-type modulation doped QW structure 22) decreases below the holding charge $Q_H$, which is the critical value of the channel charge which will sustain holding action. Thus, if the anode terminal is forward biased with respect to the cathode terminal and the n-channel injector terminal (and/or the p-channel injector terminal) is biased to produce the critical switching charge $Q_{CR}$ in the n-type modulation doped QW structure 32 (or in the p-type modulation doped QW structure 22), then the device will switch to its conducting/ON state. If the current I in the conducting/ON state is above the threshold for lasing $I_{TH}$, then photon emission will occur within the device structure. For the vertical cavity surface emitting laser, the photon emission within the device structure produces the optical mode that is emitted vertically through the top surface of the device structure. For the whispering gallery microresonator, the photon emission within the device structure produces the whispering gallery mode signal that circulates in the waveguide region of the whispering gallery microresonator. For the closed-loop microresonator, the photon emission within the device structure produces the optical mode signal that circulates in the closed-loop waveguide of the closed-loop microresonator.

For the thyristor detector, the device structure switches from a non-conducting/OFF state (where the current I through the device is substantially zero) to a conducting/ON state (where current I is substantially greater than zero) in response to an input optical signal that produces charge in the n-type modulation doped QW structure 32 and/or the p-type modulation doped QW structure 22 resulting from photon absorption of the input optical signal. Specifically, the anode terminal electrode is forward biased with respect to the cathode terminal electrode and the voltage between n-channel injector and the anode electrode (and/or the voltage between the p-channel injector and the cathode terminal electrode) is biased such that that charged produced in the n-type modulation doped QW structure 32 (and/or the p-type modulation doped QW structure 22) resulting from photon absorption of the input optical pulse is greater than the critical switching charge $Q_{CR}$. When the input optical signal is removed, the device switches from the conducting/ON state (where the current I is substantially greater than zero) to a non-conducting/OFF state (where current I is substantially zero) when the charge in the n-type modulation doped QW structure 32 (and/or the p-type modulation doped QW structure 22) decreases below the holding charge $Q_H$. For the vertical cavity surface detector, the device structure absorbs the optical mode that is received vertically through the top surface of the device structure. For the whispering gallery microresonator, the device structure absorbs the whispering gallery mode that circulates in the waveguide region of the whispering gallery microresonator. For the closed-loop microresonator, the device structure absorbs the optical mode signal that circulates in the closed-loop waveguide of the closed-loop microresonator.

In alternate configurations based upon the vertical cavity surface emitting laser/detector as described above, a diffraction grating can be formed in the top mirror over the active device structure described above. For the laser, the diffraction grating performs the function of diffracting light produced within the resonant vertical cavity into light propagating laterally in a waveguide which has the top DBR mirror and bottom DBR mirror 12 as waveguide cladding layers and which has lateral confinement regions. For the detector, the diffraction grating performs the function of diffracting incident light that is propagating in the lateral direction into a vertical cavity mode, where it is absorbed resonantly in the vertical resonant cavity.

FIGS. 2A-2B, collectively, illustrate an exemplary layer structure utilizing group III-V materials for realizing the device structure of FIG. 1 as described herein. The layer structure of FIGS. 2A-2B can be made, for example, using known molecular beam epitaxy (MBE) techniques. Starting from FIG. 2B, a semiconductor layer 103 of aluminum arsenide (AlAs) and a semiconductor layer 105 of gallium arsenide (GaAs) are alternately deposited (with preferably at least seven pairs) upon a semi-insulating GaAs substrate 101 in sequence to form the bottom DBR mirror layers 12. The number of AlAs layers 103 will preferably always be one greater than the number of GaAs layers 105 so that the first and last layers of the mirror are shown as layer 103. In the preferred embodiment, the AlAs layers 103 are subjected to high temperature steam oxidation during fabrication to produce the compound $Al_xO_y$ so that a mirror will be formed at the designed center wavelength. This center wavelength is selected such that all of the desired resonant wavelengths for the device structures will be subject to high reflectivity. In one embodiment, the thicknesses of layers 103 and 105 in the DBR mirror can be chosen so that the final optical thickness of GaAs and $Al_xO_y$ are one quarter wavelength of the center wavelength $\lambda_C$. Alternatively the mirrors could be grown as alternating layers of one-quarter wavelength thickness of GaAs and AlAs at the designed wavelength so that the oxidation step is not used. In that case, many more pairs are required (with typical numbers such as 27.5 pairs) to achieve the reflectivity needed for efficient optical lasing and detection. The layers 103 and 105 correspond to the bottom DBR mirror layers 12 of FIG. 1 as described above. The substrate 101 corresponds to the substrate 10 of FIG. 1 as described above.

Deposited on the last bottom mirror layer 103 is the active device structure which begins with layer 109 of N+ type GaAs that enables the formation of ohmic contacts thereto. Layer 109 has a typical thickness near 1849 Å and a typical n-type doping of $3.5 \times 10^{18}$ cm$^{-3}$. The N+ doped GaAs layer 109 corresponds to the bottom n-type ohmic contact layer 14 of FIG. 1 as described above.

Deposited on layer 109 is layer 111 of N+ type AlAs that functions as an etch stop layer for forming electrical contacts to the N-type ohmic contact layer 109. Layer 111 has a typical thickness near 759 Å and a typical n-type doping of $3.5 \times 10^{18}$ cm$^{-3}$. N+ AlAs layer 111 allows a selective wet etch operation (preferably in citric acid followed by BHF) that locally planarizes the layer structure at the top of the ohmic layer 109. In one embodiment, etching of layer structure in citric acid stops automatically at the N+ AlAs layer 111 followed by etching in BHF to remove remaining portions of the N+ AlAs layer 111. Such selective etch operations expose portions of the top of the ohmic contact layer 109 and thus locally planarizes the layer structure at the top of the ohmic contact layer 109. The N+ doped AlAs layer 111 corresponds to the etch stop layer(s) 16 of FIG. 1 as described above.

Deposited on layer 111 are four layers (113, 115, 117, 119) comprising a stack of an alternating GaAs material and an alloy of AlGaAs. These four layers 113, 115, 117, 119 collectively have a total thickness of about 124 Å and doped N+ with a typical n-type doping of $3.5 \times 10^{18}$ cm$^{-3}$. The first layer 113 is GaAs material with a typical thickness of 12 Å. The second layer 115 is an alloy of $Al_{x1}Ga_{(1-x1)}As$ where the parameter x1 is preferably 15% and with a typical thickness of 20 Å. The third layer 117 is GaAs material with a typical thickness of 12 Å. The fourth layer 119 is an alloy of $Al_{x1}Ga_{(1-x1)}As$ where the parameter x1 is preferably 15% and with a typical thickness of 80 Å. The stack of layers 113, 115, 117, 119 function electrically as part of the gate region of the p-channel HFET and the bottom n-type regions of the vertical thyristor device and optically provides lower waveguide cladding and optical confinement. Layer 119 forms the bottom plate of a capacitor (layers 119, 121, 123) that defines the input capacitance of the gate region of the p-channel HFET. Layers 113, 115 and 117 provide a transition from the etch stop layer 111 to layer 119. Layer 113 can allow a temperature change between the growth of the AlAs etch layer 111 and the 15% AlGaAs of layer 115. Layer 117 allows the temperature to be dropped and then reestablished which traps growth impurities and improves the morphology for the spacer layer 121. Layer 119 can incorporate sufficient N+ doping to limit the penetration of the capacitor spacer layer 121 by depletion into layer 119. The n-type layers 113, 115, 117, 119 correspond to the n-type layer(s) 18 of FIG. 1.

Next is an undoped spacer layer 121 formed from an alloy of $Al_{x1}Ga_{(1-x1)}As$ where the parameter x1 is preferably 15% and with a typical thickness of 140 Å. Spacer layer 121 forms the spacer layer between the bottom plate (layer 119) and top plate (layer 123) of the capacitor that defines the input capacitance of the gate region of the p-channel HFET. The undoped AlGaAs layer 121 corresponds to the spacer layer(s) 20 of FIG. 1 as described above.

Next is a thin p-type charge sheet 123 formed from an alloy of $Al_{x1}Ga_{(1-x1)}As$ where the parameter x1 is preferably 15%. Layer 123 is doped P+ with a typical p-type doping of $7 \times 10^{18}$ cm$^{-3}$ and has a typical thickness of 45 Å. Charge sheet 123 forms the top plate of the capacitor (layers 119, 121, and 123) that defines the input capacitance of the gate region of the p-channel HFET. Charge sheet 123 also functions as the p-type modulation doped layer for the inverted p-type modulation doped quantum structure formed thereabove. Next is an undoped spacer layer 125 formed from an alloy of $Al_{x1}Ga_{(1-x1)}As$ where the parameter x1 is preferably 15%. Layer 125 has a typical thickness of 15 Å. Next is an undoped layer 127 formed from GaAs having a typical thickness of 15 Å. Next, an undoped InGaAs barrier layer 131 and GaAs quantum well layer 133 are repeated for a number of quantum wells (such as two or more quantum wells) for the inverted p-type modulation doped quantum structure 22. Single quantum well structures may also be used. The undoped InGaAs barrier layer 131 is formed from an alloy of $In_{x1}Ga_{(1-x1)}As$, where the parameter x1 is preferably 20%. Layer 131 has a typical thickness of 60 Å. The GaAs quantum well layer 133 has a typical thickness of 100 Å. Next is an undoped barrier layer 135 formed from GaAs having a typical thickness of 150 Å. Layers 123 to 135 correspond to the inverted p-type modulation doped quantum structure 22 of FIG. 1 as described above.

An undoped layer 137 of AlAs follows the last barrier layer 135. Layer 137 has a typical thickness of 8 Å. The AlAs layer 137 allows a selective wet etch operation (preferably in citric acid followed by BHF) that locally planarizes the layer structure at the top barrier layer 135 of the p-type modulation doped quantum well structure. In one embodiment, etching of layer structure in citric acid stops automatically at the AlAs layer 137 followed by etching in BHF to remove remaining portions of the AlAs layer 137. Such selective etch operations expose portions of the last barrier layer 135 of the p-type modulation doped quantum well structure and thus locally planarizes the layer structure at the last barrier layer 135 of the p-type modulation doped quantum well structure. The AlAs layer 137 can function as an etch stop layer for implanting p-type ions to form p-type ion implant contact regions that contact the p-type modulation doped quantum well structure as well as for forming electrodes that are in electrical contact with the p-type modulation doped quantum well structure via such p-type ion implant contact regions. Layer 137 corresponds to etch stop layer(s) 24 of FIG. 1 as described above.

Following layer 137 is an undoped spacer layer 139 formed from an alloy of $Al_{x1}Ga_{(1-x1)}As$, where the parameter x1 is preferably 15%. Layer 139 has a typical thickness of 500 Å. Layer 139 corresponds to the spacer layer(s) 26 of FIG. 1 as described above.

An undoped layer 141 of AlAs follows the spacer layer 139. Layer 141 has a typical thickness of 8 Å. AlAs layer 141 allows a selective wet etch operation (preferably in citric acid followed by BHF) that locally planarizes the layer structure at spacer layer 139. In one embodiment, etching of layer structure in citric acid stops automatically at the AlAs layer 141 followed by etching in BHF to remove remaining portions of the AlAs layer 141. Such selective etch operations expose portions of the spacer layer 139 and thus locally planarizes the layer structure at spacer layer 139. The AlAs layer 141 can function as an etch stop layer for implanting p-type ions to form p-type ion implant contact regions that contact the spacer layer 139 as well as for forming electrodes that are in electrical contact with the spacer layer 139 via such p-type ion implant contact regions. Layer 141 corresponds to etch stop layer(s) 28 of FIG. 1 as described above.

Following layer 141 is an undoped spacer layer 143 formed from an alloy of $Al_{x1}Ga_{(1-x1)}As$, where the parameter x1 is preferably 15%. Layer 143 has a typical thickness of 1600 Å. Layer 143 correspond to the spacer layer(s) 30 of FIG. 1 as described above.

Following spacer layer 143 is a layer 145 of GaAs with a thickness on the order of 150 Å. Next is a GaAs quantum well layer 147 and an undoped InGaAs barrier layer 149 that are repeated for a number of quantum wells (such as two or more quantum wells) for the n-type modulation doped quantum structure. Single quantum well structures may also be used. The GaAs quantum well layer 147 has a typical thickness of 100 Å. The undoped InGaAs barrier layer 149 is formed from an alloy of $In_{x1}Ga_{(1-x1)}As$, where the parameter x1 is preferably 20%. Layer 149 has a typical thickness of 60 Å. Next is an undoped spacer layer 151 formed from GaAs with a typical thickness of 15 Å followed by an undoped spacer layer 153 formed from AlGaAs with a typical thickness of 15 Å. The AlGaAs spacer layer 153 is formed from an alloy of $Al_{x1}Ga_{(1-x1)}As$, where the parameter x1 is preferably 15%. Next is a thin n-type charge sheet 155 formed from an alloy of $Al_{x1}Ga_{(1-x1)}As$, where the parameters x1 is preferably 15%. Layer 155 is doped N+ with a typical n-type doping of $3.5 \times 10^{18}$ cm$^{-3}$ and has a typical thickness of 45 Å. Charge sheet 155 forms the bottom plate of the capacitor (layers 155, 157, 159, 161) that defines the input capacitance of the gate region of the n-channel HFET. Charge sheet 155 also functions as the n-type modulation doped layer for the n-type modulation doped quantum structure formed therebelow. The layers 145 to 155 corresponds to the n-type modulation doped QW structure 32 of FIG. 1 as described above.

Next is an undoped spacer layer 157 formed from an alloy of $Al_{x1}Ga_{(1-x1)}As$, where the parameters x1 are preferably 15%. Layer 157 has a typical thickness of 140 Å. Spacer layer 157 forms the spacer layer between the bottom plate (layer 155) and top plate (layer 161) of the capacitor that defines the input capacitance of the gate region of the n-channel HFET. The undoped AlGaAs layer 157 corresponds to the spacer layer(s) 34 of FIG. 1 as described above.

A p-type layer 159 of AlAs follows spacer layer 157. Layer 159 is doped P+ with a typical p-type doping of $7 \times 10^{18}$ cm$^{-3}$ has a typical thickness of 8 Å. AlAs layer 159 allows a selective wet etch operation (preferably in citric acid followed by BHF) that locally planarizes the layer structure at spacer layer 157. In one embodiment, etching of layer structure in citric acid stops automatically at the p-type AlAs layer 159 followed by etching in BHF to remove remaining portions of the p-type AlAs layer 159. Such selective etch operations expose portions of the spacer layer 157 and thus locally planarizes the layer structure at spacer layer 157. The p-type AlAl layer 159 can function as an etch stop layer for implanting n-type ions to form n-type ion implant contact regions that contact the n-type modulation doped QW structure 32 as well as for forming electrodes that are in electrical contact with the n-type modulation doped QW structure 32 via such n-type ion implant contact regions. Layer 159 corresponds to etch stop layer(s) 36 of FIG. 1 as described above.

Next are two layers (161, 163) that have a total thickness of about 124 Å and are doped with p-type doping. The first layer 161 is an alloy of $Al_{x1}Ga_{(1-x1)}As$ where the parameters x1 is preferably 15%. The first layer 161 is P+ doped with a typical p-type doping of $7 \times 10^{18}$ cm$^{-3}$ and has a typical thickness of 112 Å. Layer 161 forms the top plate of the capacitor (layers 155, 157, 159, 161) that defines the input capacitance of the gate region of the n-channel HFET. Layer 161 can incorporate sufficient P+ doping to limit the penetration of the capacitor spacer layer 157 by depletion into layer 161. The second layer 163 is GaAs that is P+ doped with a typical p-type doping of $7 \times 10^{18}$ cm$^{-3}$ and has a typical thickness of 12 Å. Layer 163 provide a transition from layer 161 to the etch stop layers 165, 167. Layer 163 can allow a temperature change between the growth of the 15% AlGaAs of layer 161 and AlAs etch layers 165, 167. Layers 161 and 163 corresponds to p-type layer(s) 38 of FIG. 1 as described above.

Next are two layers (165, 167) of AlAs that have a total thickness of about 620 Å and are doped with p-type doping. The first layer 165 is P+ doped with a typical p-type doping of $7 \times 10^{18}$ cm$^{-3}$ and has a typical thickness of 20 Å. The second layer 167 is P doped with a typical p-type doping of $5 \times 10^{17}$ cm$^{-3}$ and has a typical thickness of 600 Å. The p-type AlAs layers 165, 167 allows a selective wet etch operation (preferably in citric acid followed by BHF) that locally planarizes the layer structure at layer 163. In one embodiment, etching of layer structure in citric acid stops automatically at the p-type AlAs layer 167 followed by etching in BHF to remove remaining portions of the AlAs layer 167 and 165. Such selective etch operations expose portions of layer 163 and thus locally planarizes the layer structure at layer 163. In this manner, AlAs layer 167 (and AlAs layer 165) functions as an etch stop layer for selectively etching down to expose the underlying p-type layer 163 and forming electrodes that are in electrical contact with the exposed p-type layer 163. Layer 165 is doped p++ in order to reduce the conduction barriers for holes in the conduction path for certain device, including thyristors and bipolar transistors. Layers 165 and 167 corresponds to etch stop layer(s) 40 of FIG. 1 as described above.

Next are two layers 169 and 171 that are formed from an alloy of $Al_{x1}Ga_{(1-x1)}As$ where the parameter x1 is preferably 70%. Layer 169 is P doped with a typical p-type doping of $5 \times 10^{17}$ cm$^{-3}$ and has a typical thickness of 610 Å. Layer 171 is P+ doped with a typical p-type doping of $7 \times 10^{18}$ cm$^{-3}$ and has a typical thickness of 10 Å. The AlGaAs material of layers 169 and 171 serve optically as upper waveguide cladding and optical confinement of the respective optical device. Layers 169 and 171 correspond to the p-type layer(s) 42 of FIG. 1 as described above.

Next are layers 173, 175, and 177 of P+ doped GaAs. Layer 173 has a typical p-type doping of $7 \times 10^{18}$ cm$^{-3}$ and a typical thickness near 6 Å. Layer 175 has a typical p-type doping of $7 \times 10^{18}$ cm$^{-3}$ and a typical thickness near 748 Å. The P+ doped GaAs layers 173 and 175 can be grown at different temperatures to provide a transition to the top P+ doped GaAs layer 177. Layer 177 has a typical p-type doping of $1 \times 10^{20}$ cm$^{-3}$ and typical thickness near 600 Å. The P+ doped GaAs layers 173, 175, and 177 correspond to the top p-type ohmic contact layer(s) 44 of FIG. 1 as described above.

Deposited on layer 177 is layer 179 of undoped GaAs with a typical thickness of 250 Å or more. Layer 179 can be used to form an aperture for optical devices (such as VCSELs) as described herein and to form active and passive in-plane optical waveguide structures for optical devices. Layer 179 corresponds to the undoped layer 46 of FIG. 1 as described above.

Figure 4A:
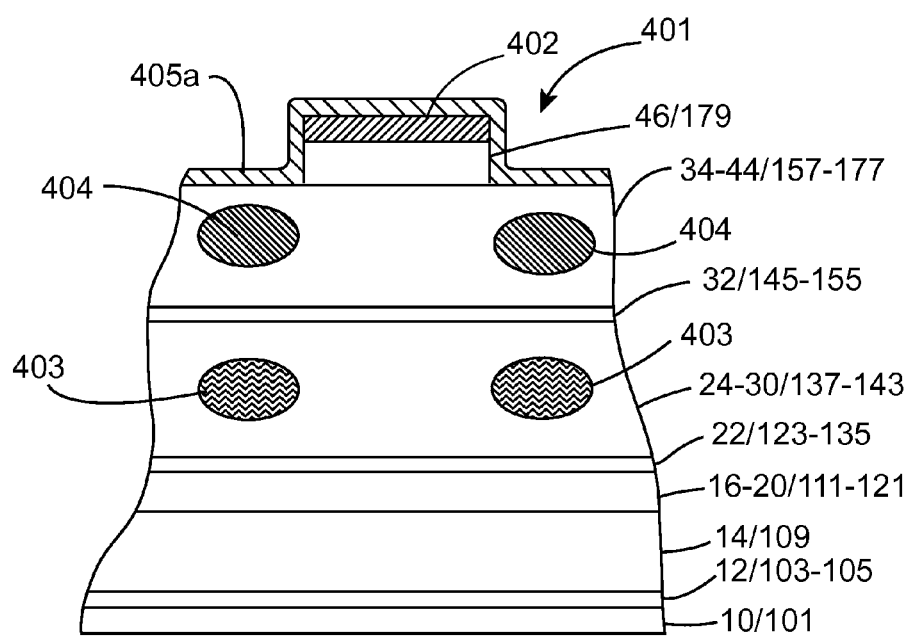
FIGS. 4A-4ZA are cross-sectional views of the optoelectronic integrated circuit device structures formed during the fabrication steps of FIGS. 3A-3L.
Figure 4B:
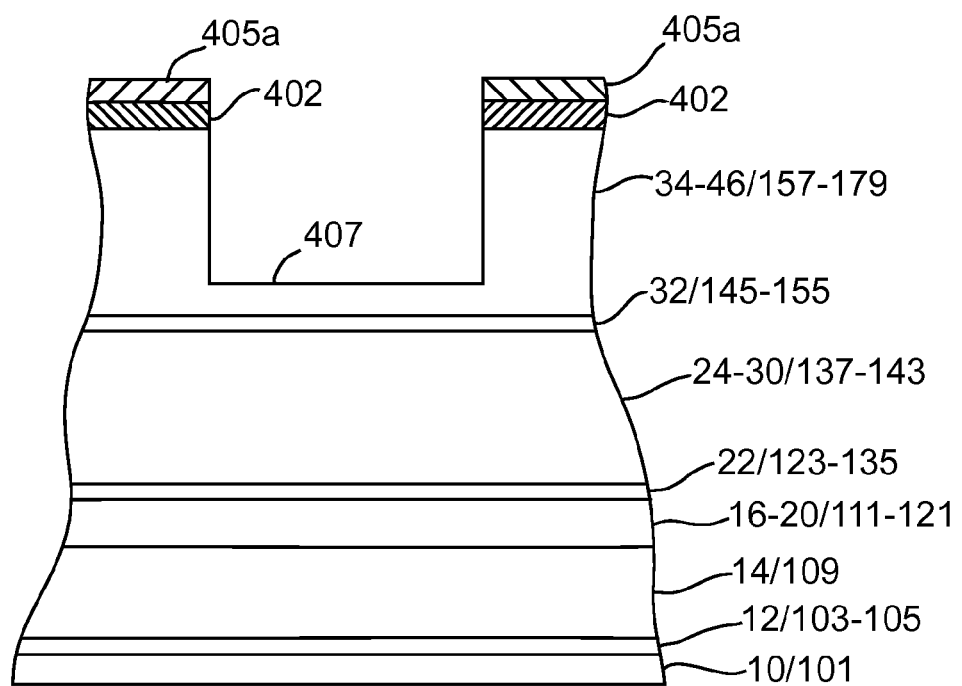
Figure 4C:
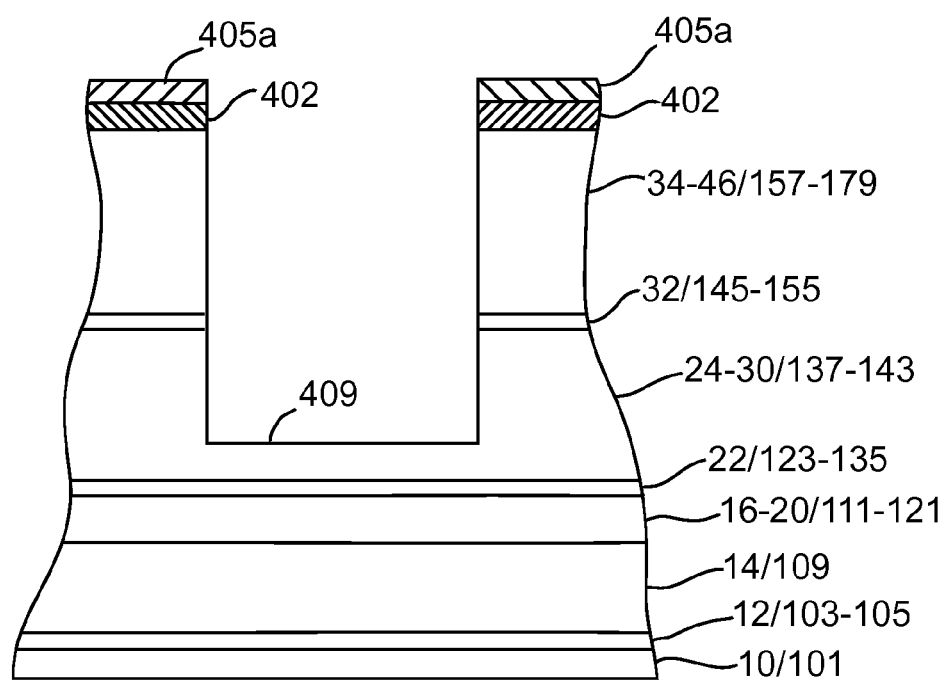
Figure 4D:
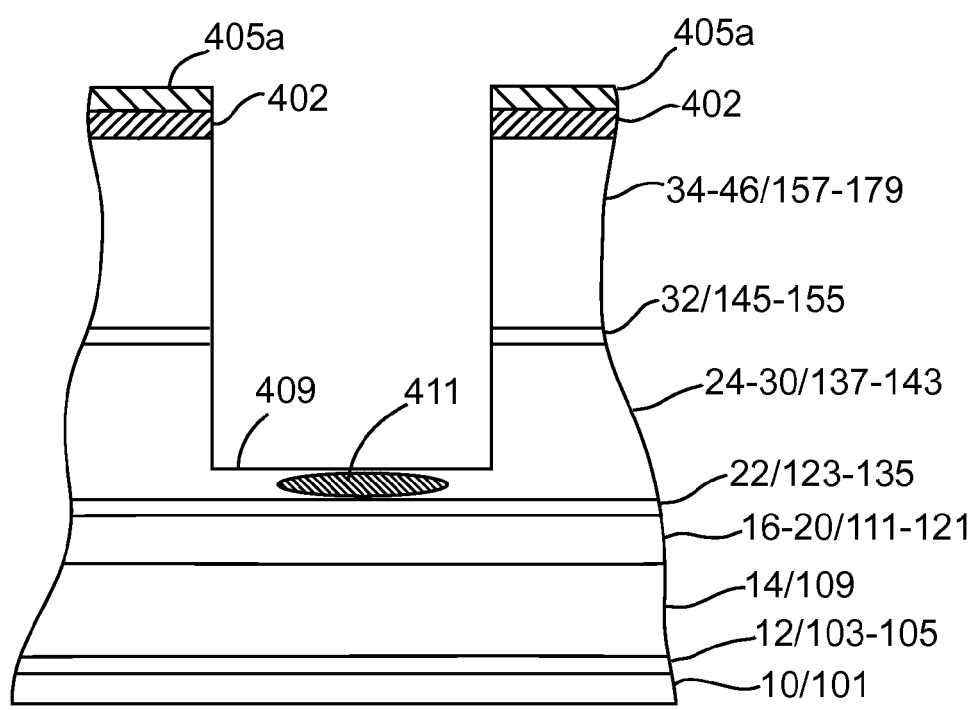
Figure 4E:
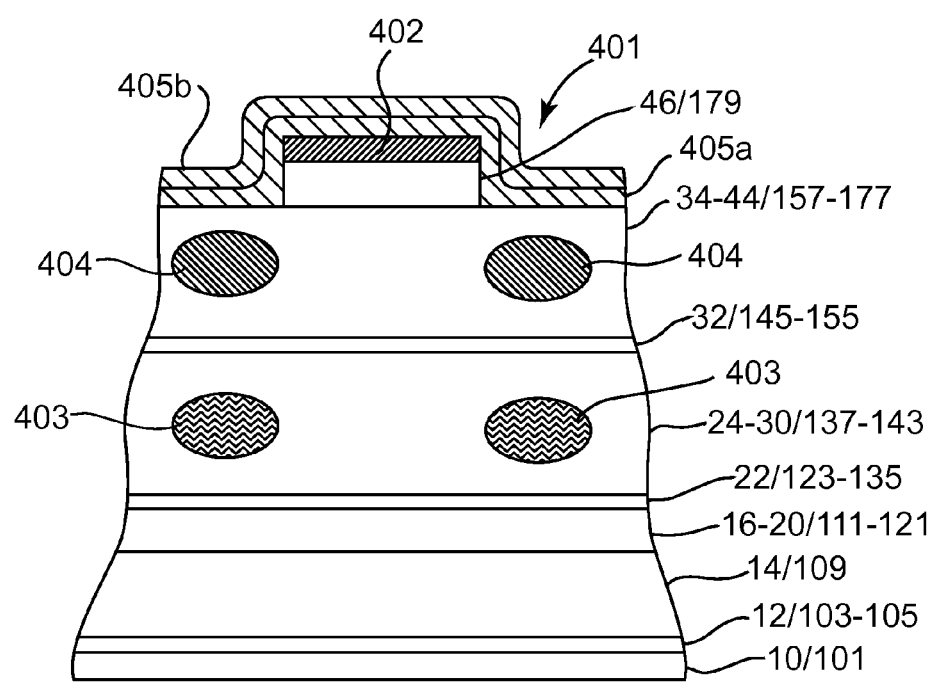
Figure 4F:
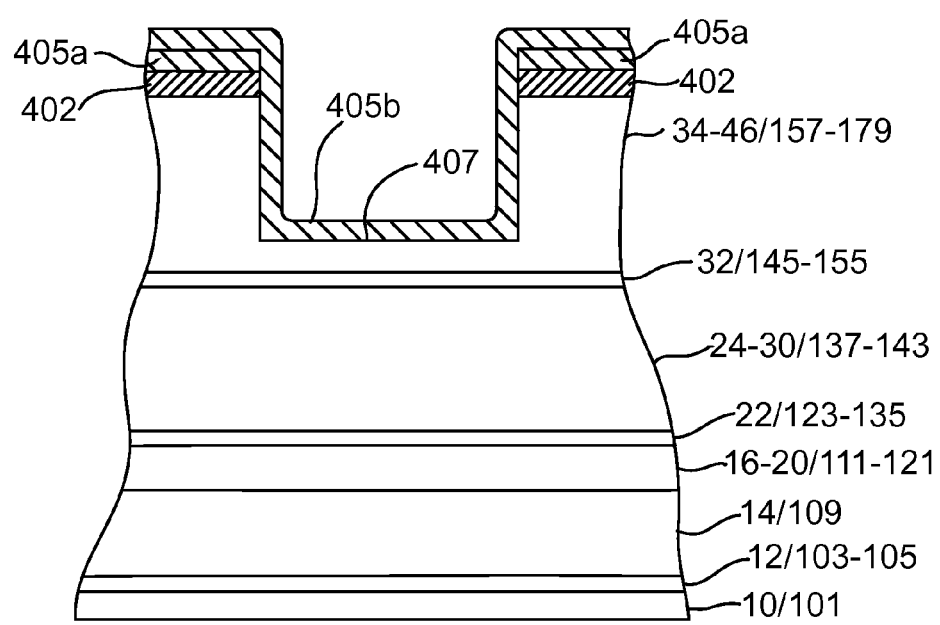
Figure 4G:
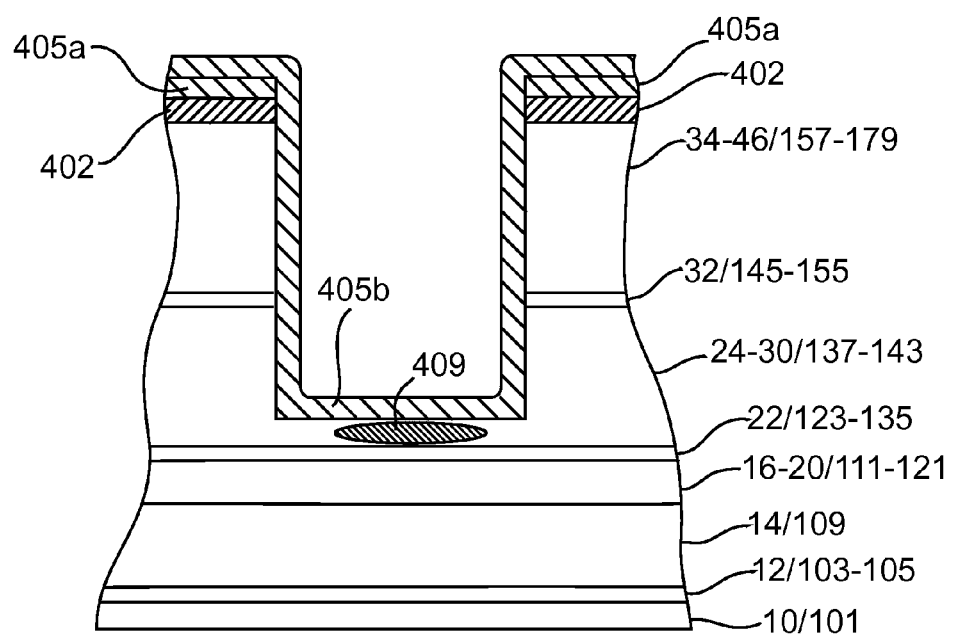
Figure 4H:
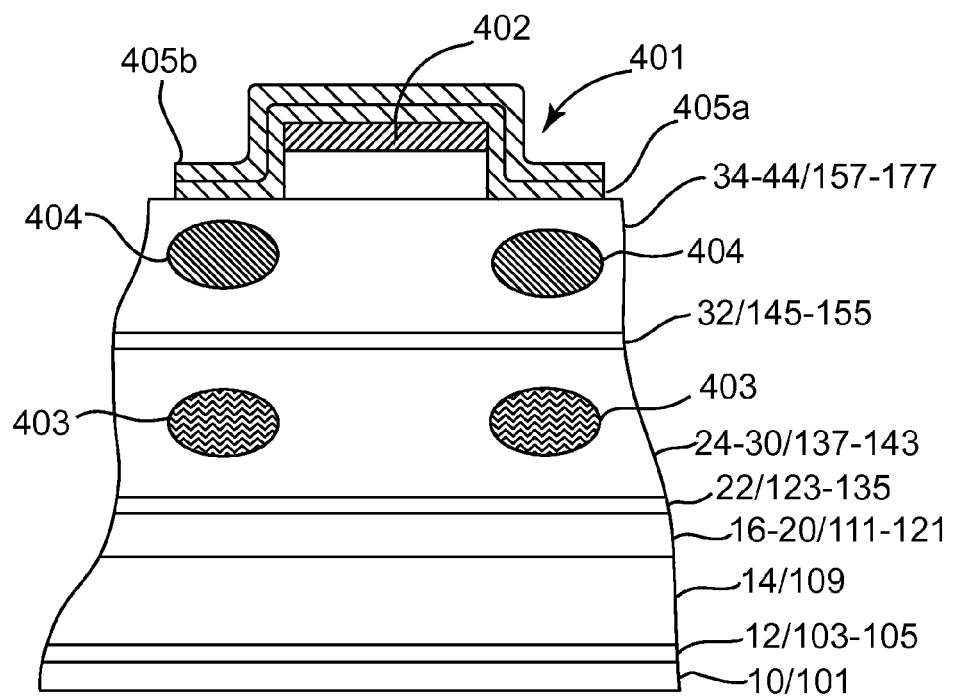
Figure 4:
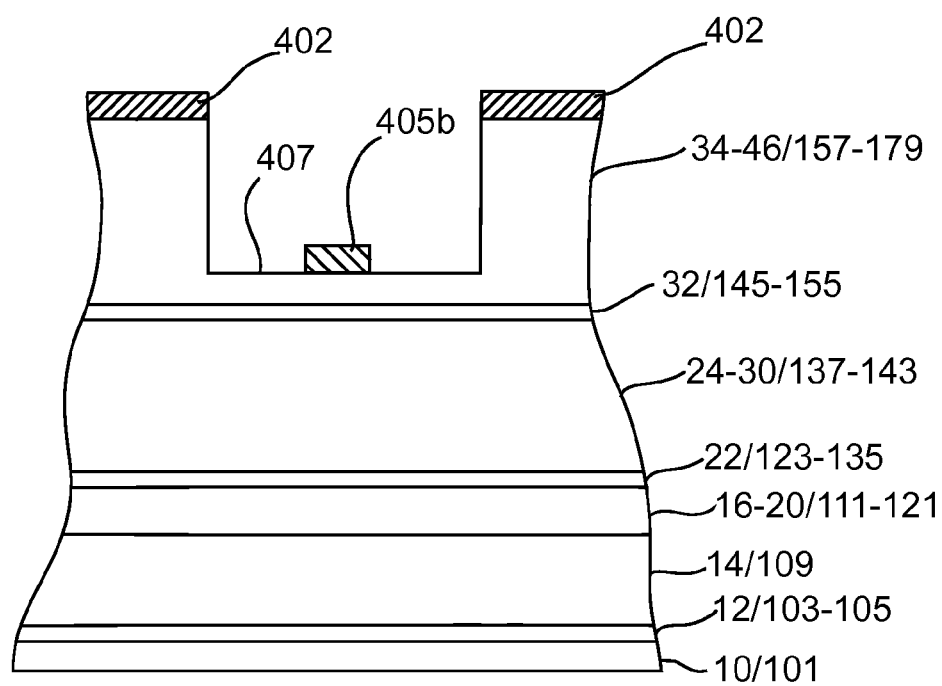
Figure 4J:
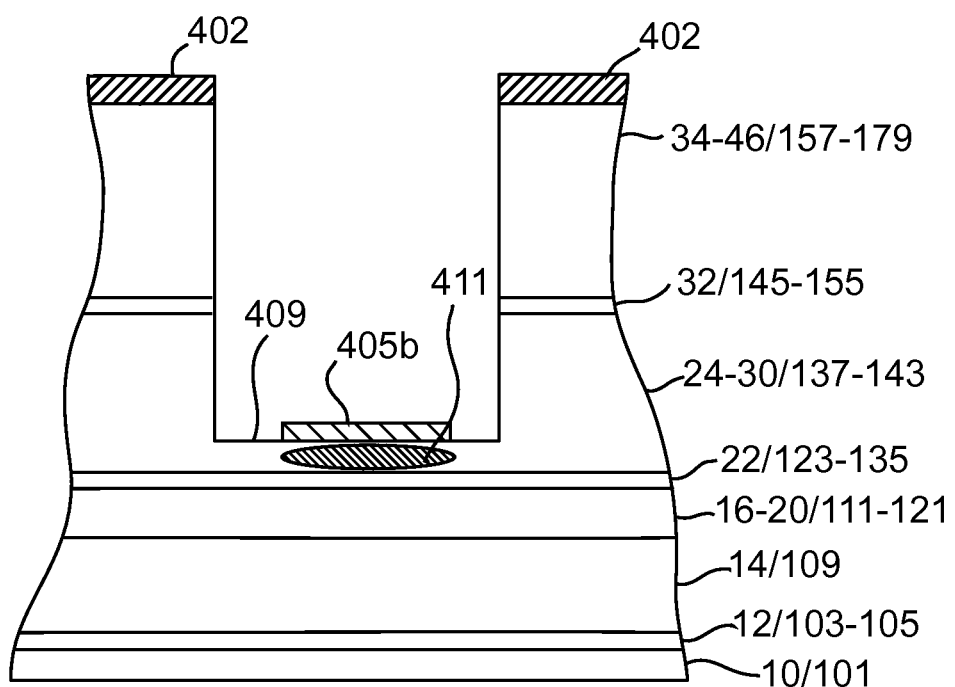
Figure 4K:
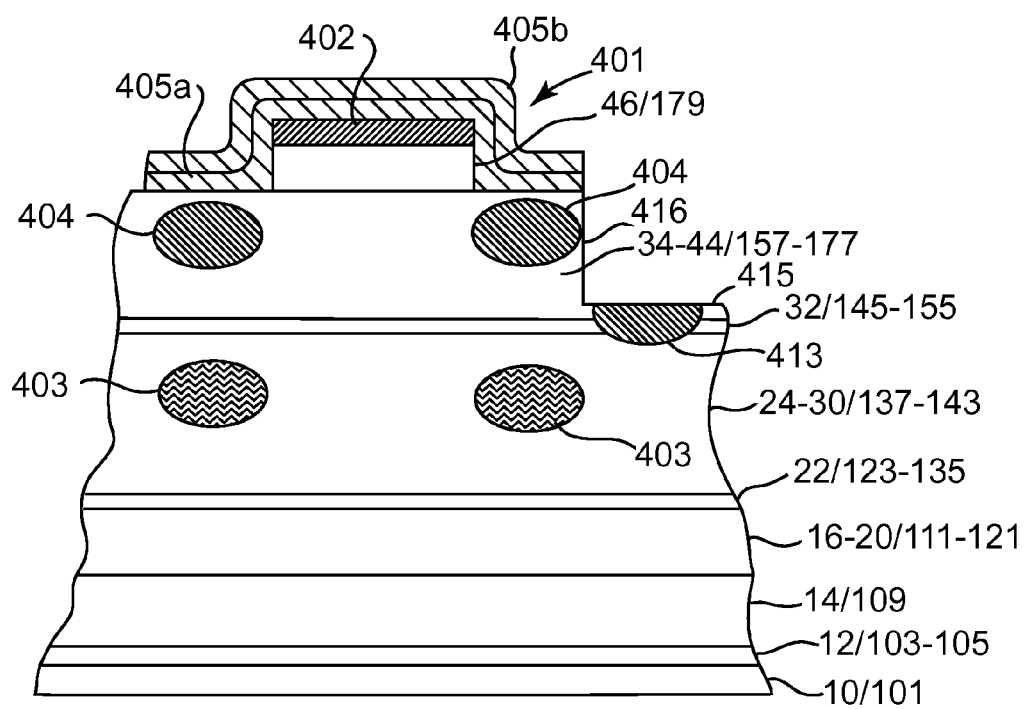
Figure 4L:
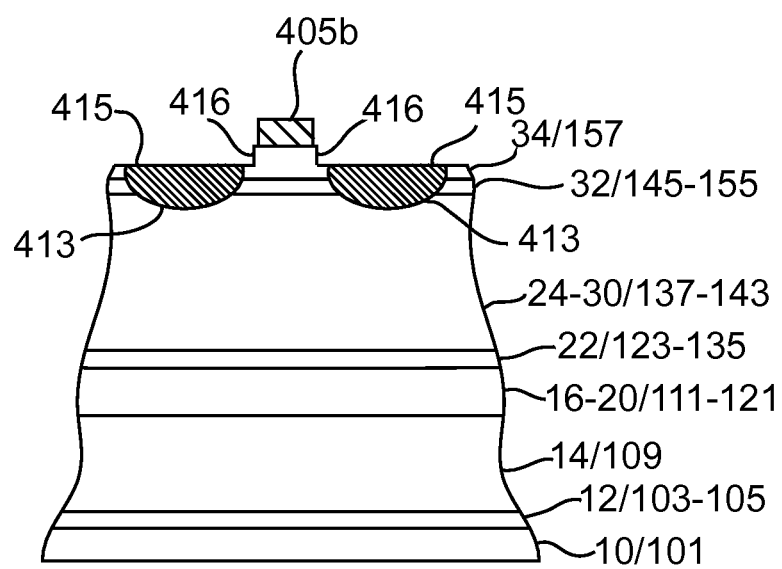
Figure 4M:
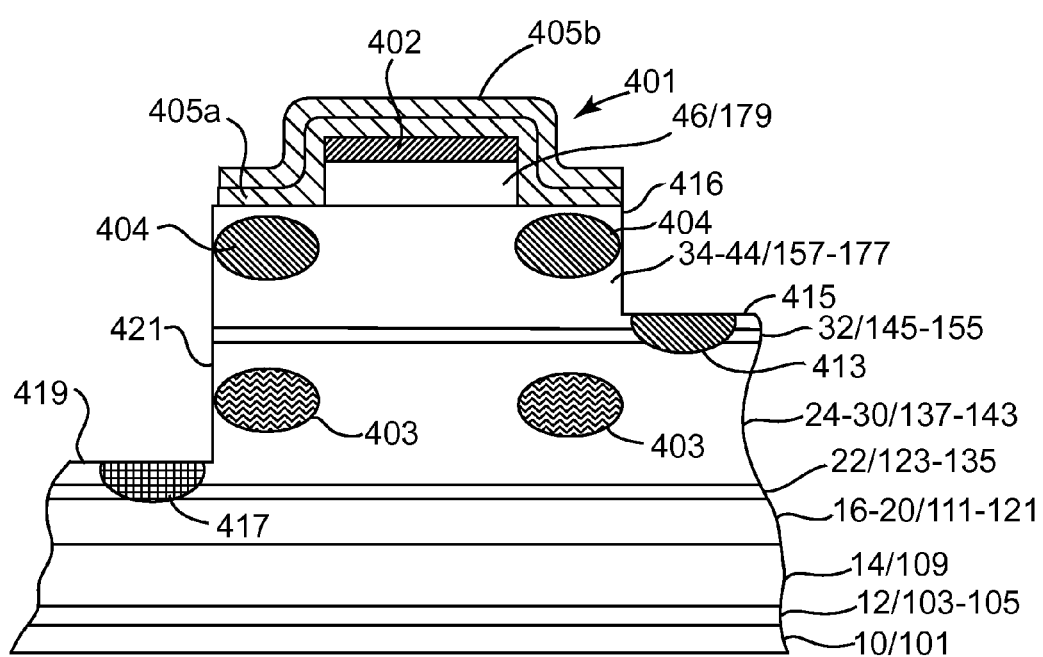
Figure 4N:
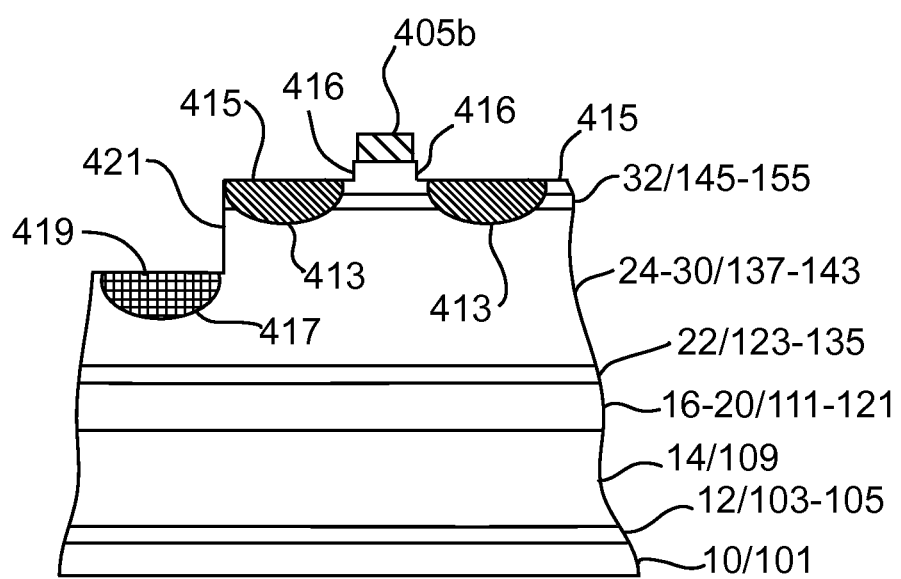
Figure 4O:
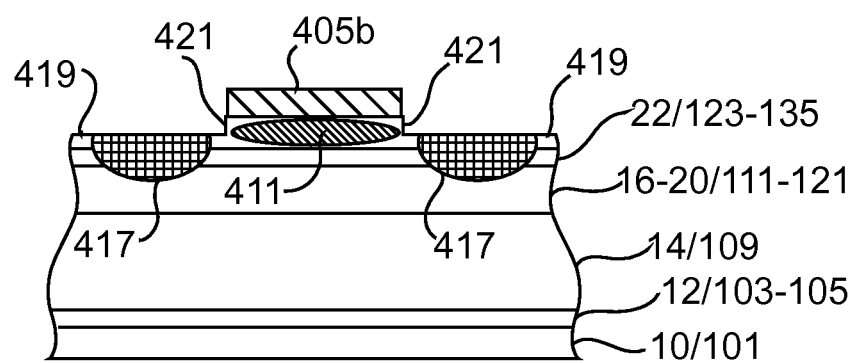
Figure 4P:
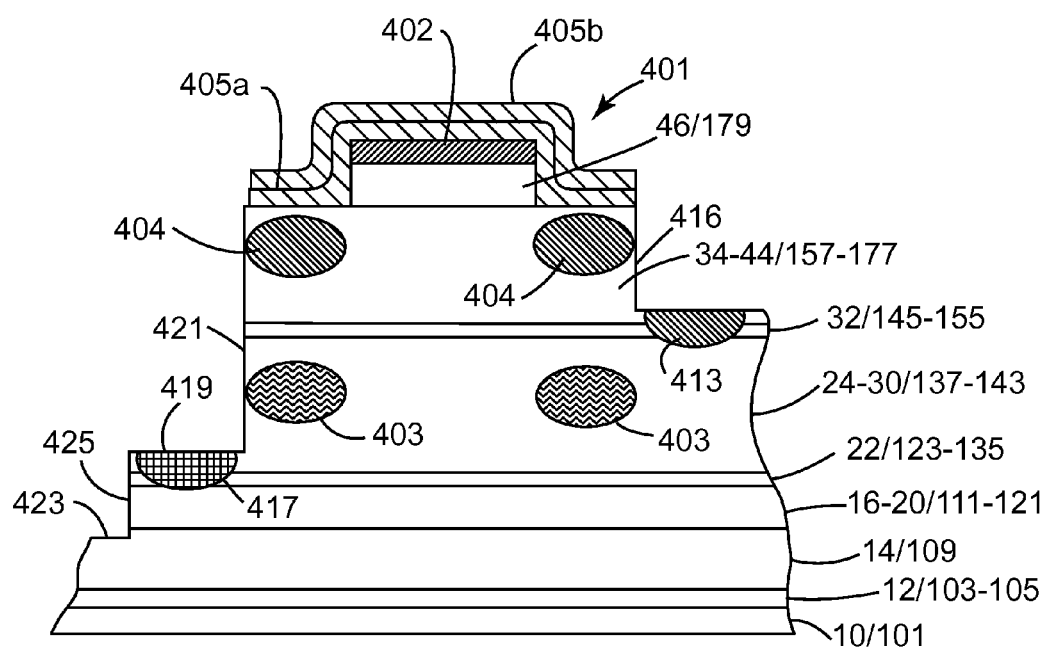
Figure 4Q:
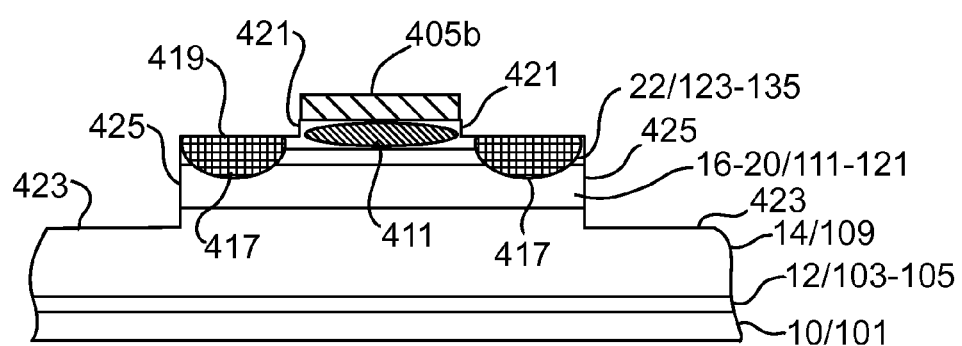
Figure 4R:
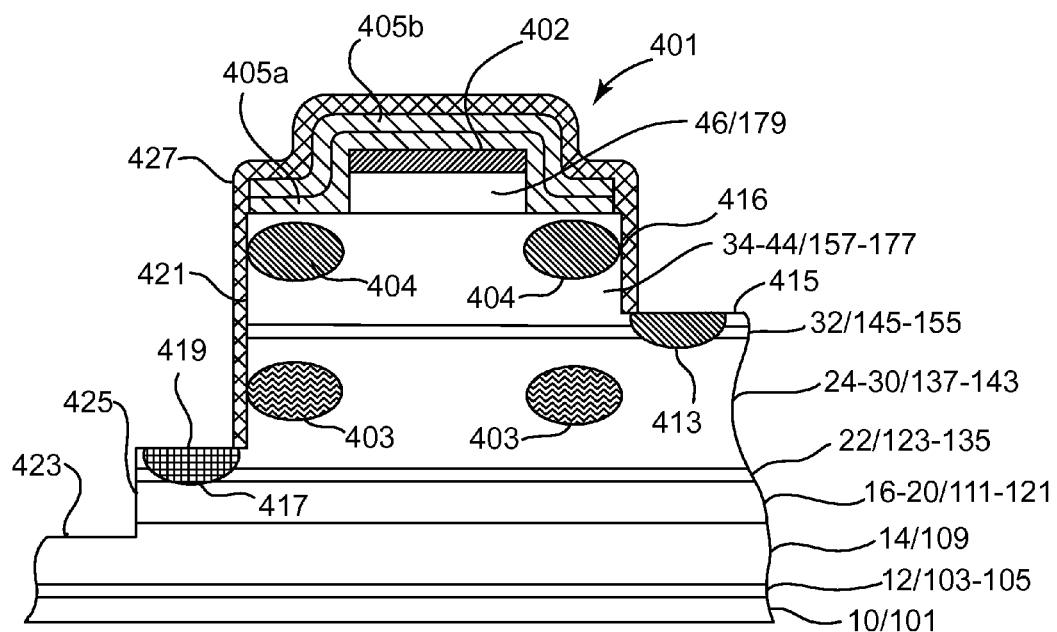
Figure 4S:
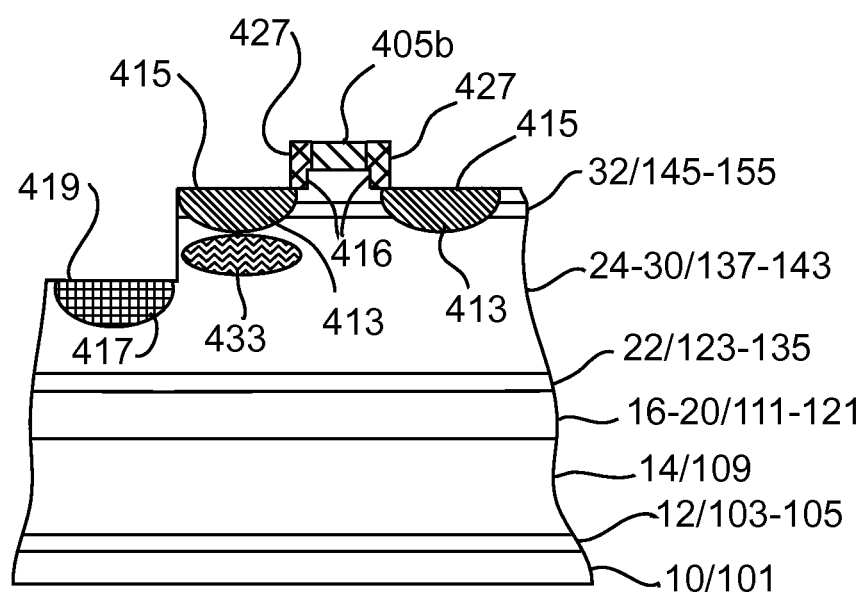
Figure 4T:
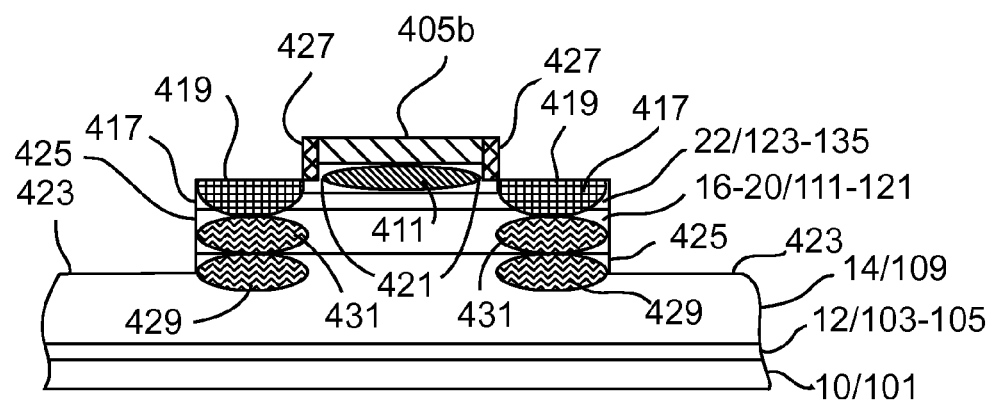
Figure 4U:
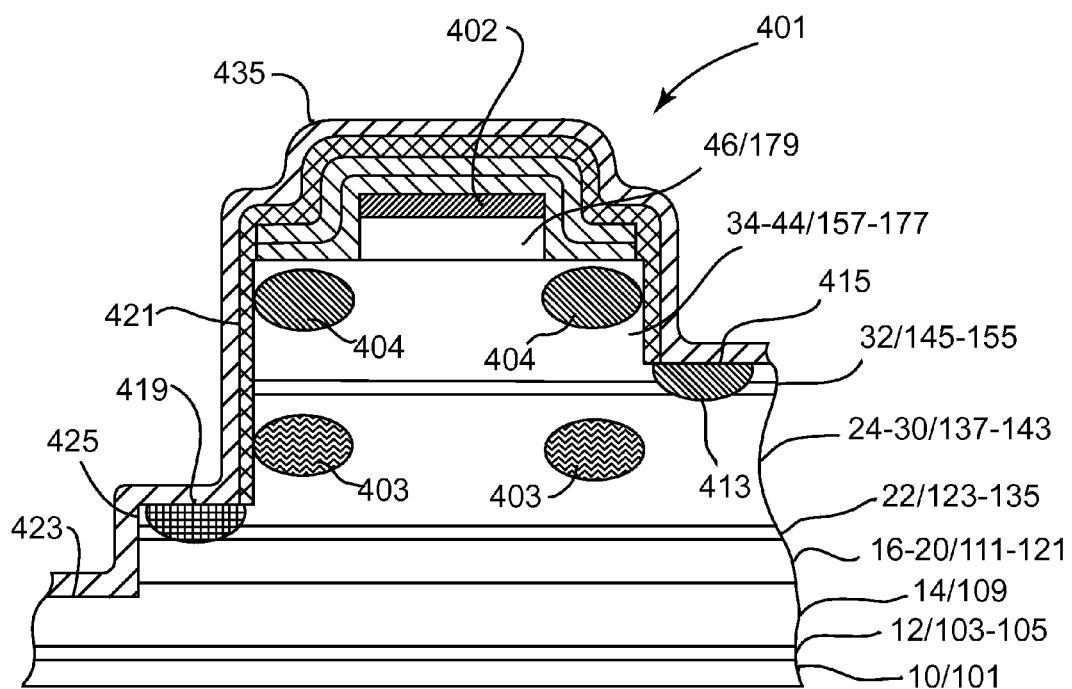
Figure 4V:
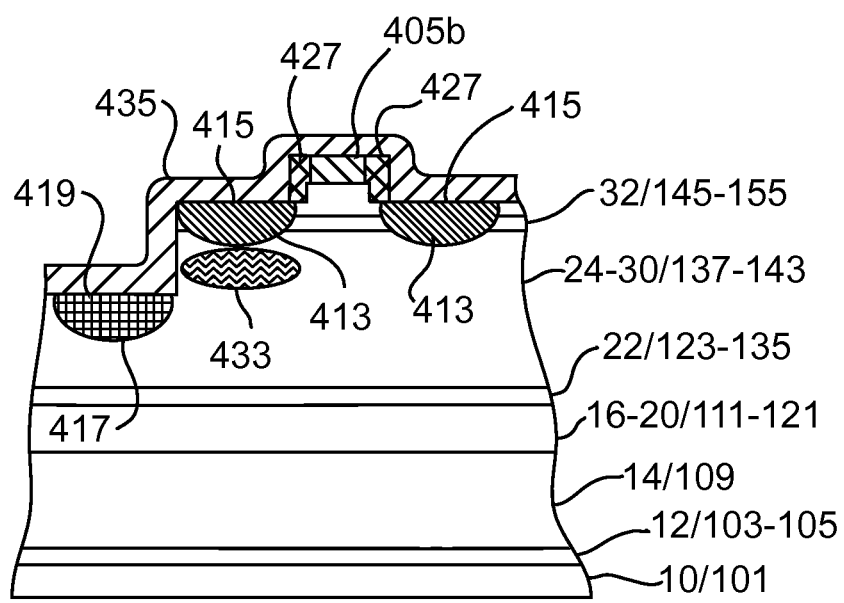
Figure 4W:
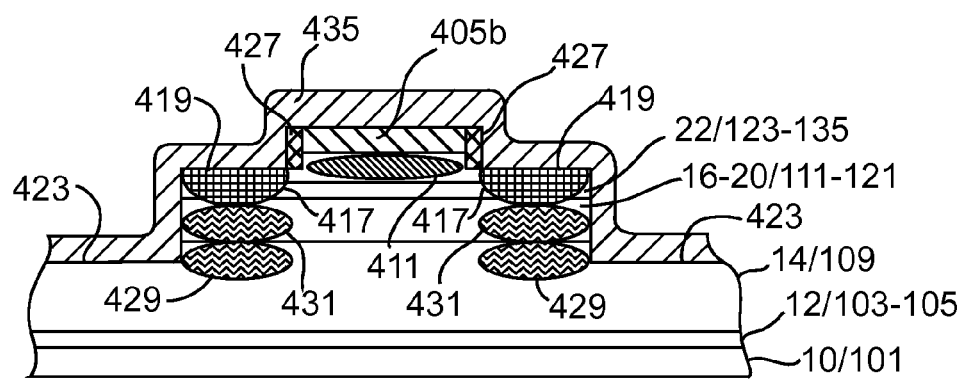
Figure 4X:
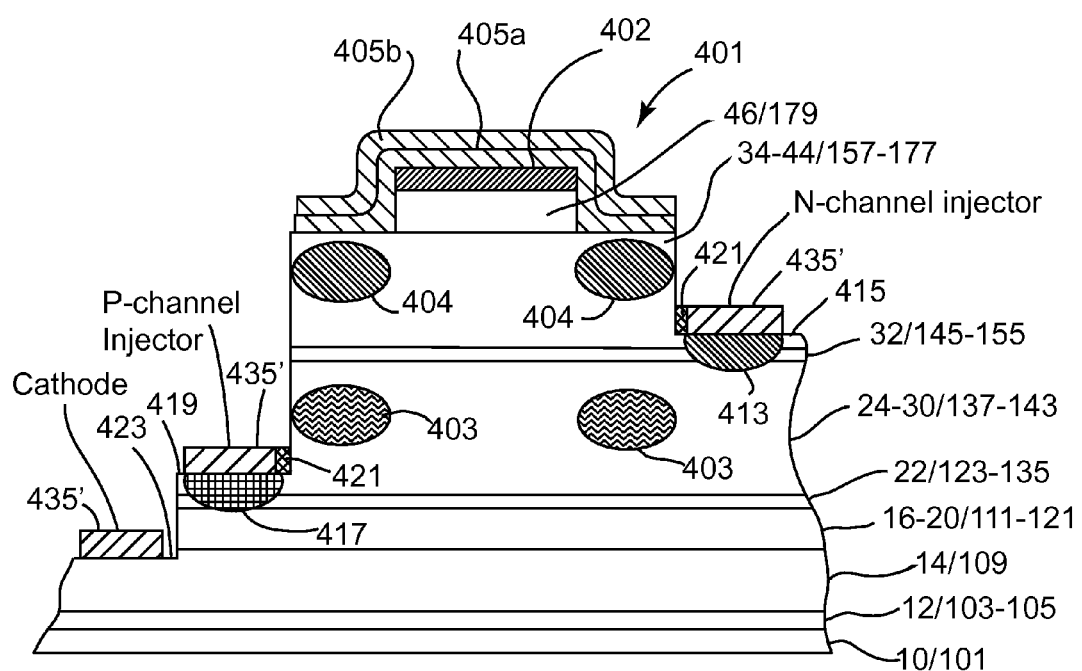
Figure 4Y:
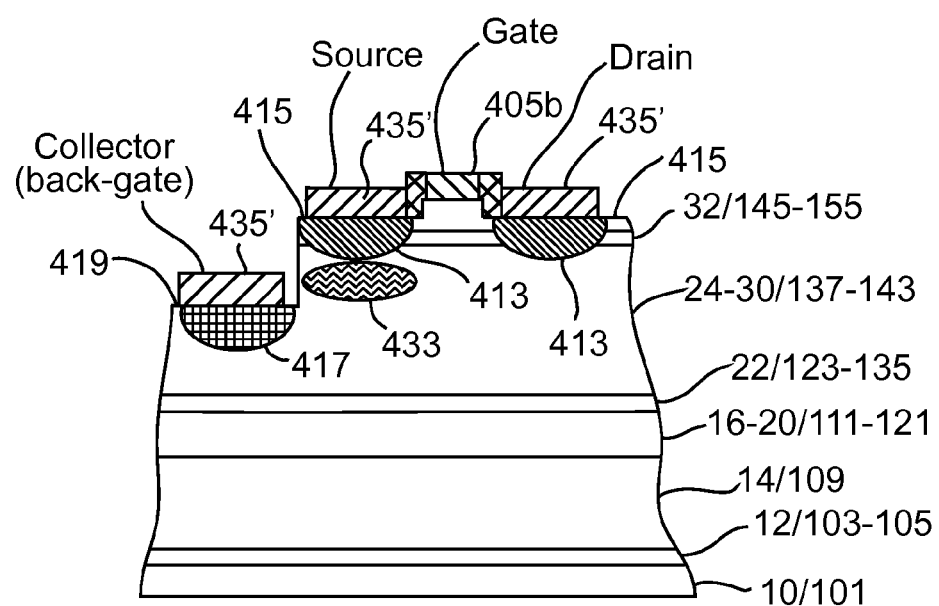
Figure 4Z:
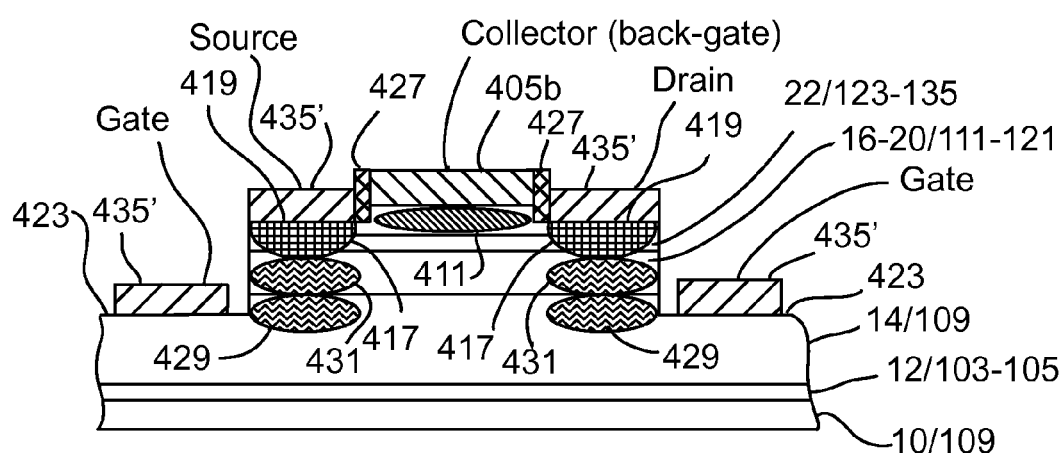
Figure 4Z:
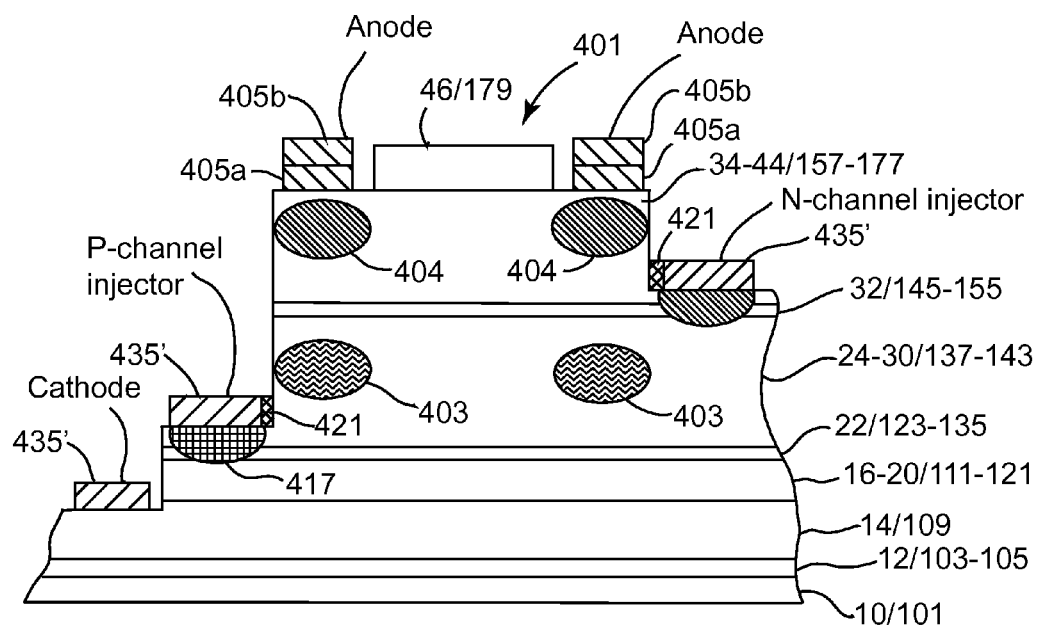

FIGS. 3A to 3L, collectively, is a flow chart and FIGS. 4A to 4ZA are schematic partial cross-sectional views that illustrate exemplary fabrication steps that can be used to form a variety of optoelectronic devices (such as optical thyristor lasers and detectors) and electrical devices (such as complementary n-channel HFET and p-channel HFET devices and electrical thyristor devices) realized in an integrated circuit (IC) that employs a semiconductor layer structure as described herein.

The steps begin in 301 where alignment marks (not shown) are defined on the semiconductor layer structure.

Steps 302 to 307 are then performed to form top apertures 401 in the semiconductor layer structure and then deposit metal on the resulting structure. In step 302, a nitride layer 402 is deposited on the semiconductor layer structure. In one embodiment, the nitride layer 402 has a thickness on the order of 500 Å.

In step 303, photoresist (not shown) is deposited and patterned. The patterned photoresist functions as an etch mask that defines a number of top apertures 401 as well as an implant mask.

In step 304, an etch operation is performed using the photoresist etch mask through the nitride layer 402 deposited in 302 and into the semiconductor layer structure down to mesas at the top ohmic contact layer (e.g., layer 44 of FIG. 1 or layer 177 of FIGS. 2A and 2B) to define the top apertures 401. The top apertures 401 have sidewalls that extend from the mesas at the top ohmic contact layer to a top surface formed in the semiconductor layer structure. The top apertures 401 define waveguide regions and/or resonance cavities for certain optical devices of the IC, such as the optical thyristor laser or detector.

In step 305, oxygen ions 403 and then n-type dopant ions 404 (e.g., SiF ions) are implanted using the photoresist implant mask into the semiconductor layer structure on opposite sides of the top apertures 401 for certain optical devices of the IC, such as the optical thyristor laser or detector. The oxygen ions 403 are implanted to a depth centered at or near the intermediate spacer layers (e.g., layers 26, 30 of FIG. 1 or layers 129, 143 of FIGS. 2A and 2B). The n-type dopant ions 404 (e.g., SiF ions) are implanted to a depth centered at or near the top etch stop layer(s) (e.g., layer 40 of FIG. 1 or layers 167, 169 of FIGS. 2A and 2B).

In step 306, the photoresist mask patterned in step 303 is removed.

In step 307, a layer of metal 405a is deposited on the resultant structure. In one embodiment, the metal layer 405a can be formed from tungsten (W) or from a combination of tungsten (95%) and indium (5%). The metal layer 405a of tungsten (W) and indium (In) can be formed by co-sputtering of tungsten and indium or other suitable means. The metal layer 405a preferably has a thickness on the order of 1500 Å. The metal 405a is deposited on the mesas formed in the top ohmic contact layer (e.g., layer 44 of FIG. 1 or layer 177 of FIGS. 2A and 2B) on opposite side of the top apertures 401 and covers the top apertures 401 (including its sidewalls and a top surface formed in the semiconductor layer structure) as shown in FIG. 4A.

In steps 308-311, mesas 407 are formed for certain devices of the IC, including the gate for n-channel HFETs. In step 308, photoresist is deposited and patterned. The patterned photoresist functions as an etch mask to define windows (areas) over certain devices of the IC, such as n-channel HFET devices of the IC.

In step 309, an etch operation is performed using the photoresist etch mask through the nitride layer 402 deposited in 302 (where present) and the metal layer 405a deposited in 307 and into the semiconductor layer structure to the top etch stop layer(s) (e.g., layer 40 in FIG. 1 or layers 165, 167 of FIGS. 2A and 2B) within the windows defined by the photoresist etch mask. The etch operation of 309 can employ a dry etchant (e.g., $BCl_3$) followed by a wet etchant (e.g., citric acid) that automatically stops at the top etch stop layer(s) (e.g., layer 40 in FIG. 1 or layers 165, 167 of FIGS. 2A and 2B) within the windows.

In step 310, a wet etch operation (e.g., using buffered hydrofluoric acid or BHF) is performed using the photoresist etch mask to remove remaining portions of the top etch stop layer(s) (e.g., layer 40 in FIG. 1 or layers 165, 167 of FIGS. 2A and 2B) within the windows to define mesas 407 at the underlying p+ doped layer (e.g., layer 38 of FIG. 1 or layer 163 of FIGS. 2A and 2B) within the windows. The mesas 407 are formed for certain devices of the IC, such as the n-channel HFET device. In this case, the mesas 407 defines an interface to the P+ gate region for the n-channel HFET device.

In step 311, the photoresist etch mask patterned in 308 is removed and the mesas 407 remain as shown in FIG. 4B.

In steps 312 to 316, mesas 409 are formed for certain devices of the IC, including the collector (back-gate) of p-channel HFETs. In step 312, photoresist is deposited and patterned. The patterned photoresist functions as an etch mask to define windows (areas) over certain devices of the IC, such as p-channel HFET devices.

In step 313, an etch operation is performed using the photoresist etch mask through the nitride layer 402 deposited in step 302 (where present) and the metal layer 405a deposited in step 307 and through the semiconductor layer structure to an intermediate layer (e.g., layer 30 in FIG. 1 or layer 143 of FIGS. 2A and 2B) disposed above a predefined etch stop layer (e.g., etch stop layer 28 in FIG. 1 or etch stop layer 141 of FIGS. 2A and 2B) within the windows defined by the photoresist etch mask. The etch operation of step 313 can employ a dry etchant (e.g., $BCl_3$).

In step 314, a wet etch operation (e.g. using citric acid) is performed using the photoresist etch mask that automatically stops at the underlying predefined etch stop layer (e.g., etch stop layer 28 in FIG. 1 or etch stop layer 141 of FIGS. 2A and 2B) within the windows.

In step 315, a wet etch operation (e.g., using BHF) is performed using the photoresist etch mask to remove remaining portions of the predefined etch stop layer(s) (e.g., etch stop layer 28 in FIG. 1 or etch stop layer 141 of FIGS. 2A and 2B) within the windows to define mesas 409 at the underlying spacer layer (e.g., spacer layer 26 of FIG. 1 or spacer layer 139 of FIGS. 2A and 2B) within the windows. The mesas 409 are formed for certain devices of the IC, such as the p-channel HFET device. In this case, the mesas 409 define an interface to the collector (back-gate) region for the p-channel HFET device.

In step 316, the photoresist etch mask patterned in step 312 is removed and the mesas 409 remain as shown in FIG. 4C.

In steps 317 to 320, N+ ions are implanted into the collector (back-gate) regions of p-channel HFETs of the IC. In step 317, a layer of nitride (not shown) is deposited on the resultant structure. In one embodiment, the nitride layer has a thickness on the order of 200 Å. The nitride layer is deposited on the mesas 409 formed on the intermediate spacer layer in step 315.

In step 318, photoresist is deposited and patterned. The patterned photoresist functions as an implant mask to define implant windows over the collector (back-gate) regions of the p-channel HFETs. Note that the nitride layer 402 deposited in 302 and the metal layer deposited in 304 have been removed by the etch operation of 312 for the areas covered by these implant windows.

In step 319, a shallow implant operation of N+ ions (e.g., SiF ions) is performed using the photoresist implant mask.

The N+ ions are implanted through the underlying nitride layer (screen) as deposited in 317 into the collector (back-gate) region of the p-channel HFETs of the IC.

In step 320, the photoresist implant mask patterned in 318 and the nitride layer deposited in 317 are removed to leave behind the N+ ion implant regions 411 in the collector (back-gate) region of the p-channel HFETs of the IC as shown in FIG. 4D. It is also contemplated that the nitride layer (screen) can possibly be omitted from the process, if desired.

In steps 321-330, metal is deposited and patterned for certain devices of the IC, such as the anode metal of optical and electrical thyristor devices, the gate metal of n-channel HFETs and collector (back-gate) metal of p-channel HFETs. In step 321, a layer of metal 405b is deposited on the resultant structure. The deposition of metal 405b adds additional metal onto the metal layer 405a previously formed on the top ohmic contact layer (e.g., layer 44 of FIG. 1 and layer 177 of FIGS. 2A and 2B) and on the top apertures 401 (see FIG. 4A). In one embodiment, the metal 405b is tungsten (W) formed by sputtering of tungsten or other suitable means. The metal layer 405b preferably has a thickness on the order of 1500 Å. In this case, the two metals layers 405a and 405b together can be on the order of 3000 Å in thickness for those areas covering the top ohmic contact layer (e.g., layer 44 of FIG. 1 or layer 177 of FIGS. 2A and 2B) on opposite side of the top apertures 401 as well as covering the top apertures 401 as shown in FIG. 4E. The deposition of metal 405b also adds metal to the mesas 407 at the top p+ doped layer (e.g., layer 38 of FIG. 1 or layer 163 of FIGS. 2A and 2B) that are defined in step 310 for the gate regions of n-channel HFET devices as shown in FIG. 4F. The deposition of metal 405b also adds metal to the mesas 409 at the intermediate spacer layer (e.g., spacer layer 26 of FIG. 1 of spacer layer 139 of FIGS. 2A and 2B) as defined in step 315 for the collector (back-gate) regions of p-channel HFET devices of the IC as shown in FIG. 4G.

In step 322, photoresist is deposited and patterned. The patterned photoresist functions as an etch mask for patterning the cumulative metal layers 405a, 405b formed on the top ohmic contact layer (e.g., layer 44 of FIG. 1 or layer 177 of FIGS. 2A and 2B) as deposited in 307 and 321.

In step 323, an etch operation is performed that uses the photoresist etch mask to pattern the cumulative metal layers 405a, 405b formed on the top ohmic contact layer (e.g., layer 44 of FIG. 1 or layer 177 of FIGS. 2A and 2B) as deposited in 307 and 321. Similar to the etch of 309, the etch operation of 323 can use a dry etchant (e.g., $BCl_3$) followed by a wet etchant (e.g., citric acid) that automatically stops at the top etch stop layer(s) (e.g., layer 40 in FIG. 1 or layers 165, 167 of FIGS. 2A and 2B).

In step 324, the photoresist etch mask patterned in step 322 is removed. The cumulative metal layers 405a, 405b that are patterned in step 323 extend over the top apertures 401 for certain devices of the IC, such as for thyristors of the IC as shown in FIG. 4H. Such patterned metal is further patterned as described below to form electrodes for certain optical devices and electrical devices of the IC, such as the anode electrodes for both optical and electrical thyristors of the IC.

In step 325, photoresist is deposited and patterned. The patterned photoresist functions as an etch mask for patterning the metal 405b deposited on the mesas 407 at the p+ doped layer (e.g., layer 38 of FIG. 1 or layer 163 of FIGS. 2A and 2B) in step 321.

In step 326, an etch operation is performed that uses the photoresist etch mask to pattern the metal 405b deposited on the mesas 407 at the p+ doped layer (e.g., layer 38 of FIG. 1 or layer 163 of FIGS. 2A and 2B) in step 321. The etch operation of 326 can employ an ebeam procedure, if suitable. The metal 405b that is patterned in step 326 forms an electrode for certain electrical devices of the IC, such as the gate electrode for n-channel HFETs as shown in FIG. 4I. An example of a mask feature 501 that is part of the etch mask that is used to pattern and form the gate electrode for an n-channel HFET is shown in FIG. 5. The feature 501 corresponds to the layout of the metal 405b that forms the gate electrode of the n-channel HFET.

In step 327, the photoresist etch mask patterned in step 325 is removed.

In step 328, photoresist is deposited and patterned. The patterned photoresist functions as an etch mask for patterning the metal 405b deposited on the mesas 409 at the intermediate spacer layer (e.g., layer 26 of FIG. 1 or layer 139 of FIGS. 2A and 2B) in step 321.

In step 329, an etch operation is performed that uses the photoresist etch mask to pattern the metal 405b deposited on the mesas 409 at the intermediate spacer layer (e.g., layer 26 of FIG. 1 or layer 139 of FIGS. 2A and 2B) in step 321. The etch operation of step 329 can employ an ebeam procedure, if suitable.

In step 330, the photoresist etch mask patterned in step 328 is removed. The metal 405b patterned in step 329 forms an electrode for certain electrical devices of the IC, such as the collector (back-gate) electrode for p-channel HFETs as shown in FIG. 4J.

In steps 331-340, mesas and nitride sidewalls are formed for certain devices of the IC, such as both n-channel and p-channel HFETs. In step 331, photoresist is deposited and patterned. The patterned photoresist functions as an etch mask for defining mesas (as well as sidewalls leading to such mesas) that are used to form contact regions to the n-type modulation doped QW channel for certain devices of the IC.

In step 332, an etch operation (for example, a dry etch operation) is performed that uses the photoresist etch mask to etch into the semiconductor layer structure down to a depth above a predefined etch stop layer (e.g., at a depth in layer 38 above the etch stop layer 36 of FIG. 1 or a depth in 161 above the etch stop layer 159 of FIGS. 2A and 2B). This etch forms mesas above the predefined etch stop layer (and sidewalls leading to such mesas) that are used to form contact regions to the n-type modulation doped QW channel.

In step 333, the photoresist etch mask patterned in step 331 is removed.

In step 334, photoresist is deposited and patterned. The patterned photoresist functions as an etch mask for defining mesas (as well as sidewalls leading to such mesas) that are used to form contact regions to the collector (back-gate) region for n-channel HFETS of the IC.

In step 335, an etch operation (for example, a dry etch operation) is performed that uses the photoresist etch mask to etch into the semiconductor layer structure down to a depth above a predefined etch stop layer (e.g., at a depth in layer 30 above the etch stop layer 28 of FIG. 1 or a depth in 143 above the etch stop layer 141 of FIGS. 2A and 2B). This etch forms mesas above the predefined etch stop layer that are used to define mesas (and sidewalls leading to such mesas) that are used to form contact regions to the collector (back-gate) region for n-channel HFETS of the IC.

In step 336, the photoresist etch mask patterned in step 334 is removed.

In step 337, photoresist is deposited and patterned. The patterned photoresist functions as an etch mask for defining mesas (as well as sidewalls leading to such mesas) that are used to form contact regions to the p-type modulation doped QW channel for certain devices of the IC, including electrical and optical thyristor devices and p-channel HFETs.

In step 338, an etch operation (for example, a dry etch operation) is performed that uses the photoresist etch mask to etch into the semiconductor layer structure down to a depth above a predefined etch stop layer (e.g., at a depth in layer 26 above the etch stop layer 24 of FIG. 1 or a depth in layer 139 above the etch stop layer 137 of FIGS. 2A and 2B). This etch forms mesas above the predefined etch stop layer that are used to define mesas (and sidewalls leading to such mesas) that are used to form contact regions to the p-type QW channel.

In step 339, the photoresist etch mask patterned in step 337 is removed.

In step 340, a layer of nitride is deposited on the resultant structure. In one embodiment, the nitride layer has a thickness between 200 Å and 500 Å. The nitride layer is deposited on the mesas and sidewalls formed in steps 332, 335 and 338.

In step 341, photoresist is deposited and patterned. The patterned photoresist functions as an etch mask for defining nitride sidewalls that are used as lateral implant spacers during subsequent implant operations for certain devices of the IC as described below.

In step 342, an etch operation (for example, a dry etch operation) is performed using the photoresist etch mask to define sidewalls formed by the nitride layer deposited in step 340. The nitride sidewalls function as lateral implant spacers for certain devices of the IC, including thyristors devices, n-channel HFET devices and p-channel HFET devices. For the thyristor devices, the nitride sidewalls protect desired parts of the semiconductor layer structure such that subsequent implant operations that form the N+ ion-implanted contact regions for the n-channel injector contacts (step 345) as well as subsequent implant operations that form the P+ ion-implanted contact regions for the p-channel injector contacts (step 350) do not reach into the protected parts of the semiconductor layer structure. Such nitride sidewalls are similar to the nitride sidewalls described below and part of the covering nitride layer 427 shown in FIG. 4R. For the n-channel HFET devices, the nitride sidewalls protects the gate regions of the n-channel HFET devices such that subsequent implant operations that form N+ ion-implanted regions for source and drain contacts (step 345) does not reach across such gate regions. Such nitride sidewalls are similar to the nitride sidewalls described below and part of the covering nitride layer 427 shown in FIG. 4S. For the p-channel HFET devices, the nitride sidewalls protects the collector (back-gate) gate regions of the p-channel HFET devices such that subsequent implant operations that form the P+ ion-implanted contact regions for source and drain contacts (step 350) does not reach across such collector (back-gate) regions. Such nitride sidewalls are similar to the nitride sidewalls described below and part of the covering nitride layer 427 shown in FIG. 4T.

In step 343, the photoresist etch mask patterned in step 341 is removed.

In steps 344-348, n-type ions are implanted into the resultant structure to form N+ ion-implanted contact regions for contact to n-type QW channel for certain electrical and optical devices of the IC, including thyristor devices and n-channel HFET devices. In step 344, photoresist is deposited and patterned. The patterned photoresist functions as both an implant mask and etch mask. The patterned photoresist defines windows on the mesas formed in step 332 to form N+ ion-implanted contact regions 413 to the n-type modulation doped QW channel. For thyristor devices, the nitride layer 402 and patterned metal layers 405a, 405b that overlay the top aperture 401 of the thyristor devices of the IC can act as an implant mask that protects the underlying waveguide region of the thyristor devices for the implant operations that form the N+ ion-implanted contact regions (FIG. 4K). For n-channel HFET devices, the gate metal 405b can act as an implant mask that protects the underlying gate region of the n-channel HFET devices for such implant operations that form the N+ ion-implanted contact regions (FIG. 4L).

In step 345, an implant of N+ ions (e.g., SiF ions) is performed through the windows defined by the photoresist mask and into the semiconductor layer structure to form N+ ion-implanted contact regions 413 to the n-type modulation doped QW channel. These N+ ion-implanted contact regions 413 define source and drain contact regions that contact the n-type modulation doped QW channel of the n-channel HFET devices of the IC (FIG. 4L) as well as n-channel injector contact regions that contact the n-type modulation doped QW channel of the optical and electrical thyristor devices of the IC (FIG. 4K). In one embodiment, the peak ion density of the N+ ion-implanted contact regions 413 can be at or near a predefined etch stop layer (e.g., layer 36 of FIG. 1 or layer 159 of FIGS. 2A and 2B). During the implant operation of step 345, the nitride sidewalls formed in step 342 function as lateral implant spacers for certain devices of the IC. Specially, for thyristor devices, the nitride sidewalls protect the top p-type region of the thyristor such that implant operation of step 345 does not reach into the top p-type region of the semiconductor layer structure of the thyristor device. For the n-channel HFET devices, the nitride sidewalls formed in step 342 protects the gate regions of the n-channel HFET devices such that the implant operation of step 345 does not reach across such gate regions.

An example of mask feature 503 that is part of the implant/etch mask used to form N+ ion-implanted contact regions for an n-channel HFET is shown in FIG. 5. The feature 503 corresponds to the layout of the N+ ion-implanted contact regions and corresponding mesas that are used to contact to n-type QW channel for the source and drain electrodes of the n-channel HFET as described herein.

In step 346, a wet etch operation (e.g., using citric acid) is performed that etches through the windows defined by the photoresist mask and into the semiconductor layer structure and automatically stops at a predefined etch stop layer (e.g., layer 36 of FIG. 1 or layer 159 of FIGS. 2A and 2B) within the windows. This etch operation also etches away the semiconductor layer structure under exposed nitride sidewalls and removes these nitride sidewalls leaving behind sidewalls in the semiconductor layer structure.

In step 347, a wet etch operation (e.g., using BHF) is performed that etches through the windows defined by the photoresist mask to remove remaining portions of the predefined etch stop layer to define mesas 415 at the underlying layer (e.g., spacer layer 34 of FIG. 1 or spacer layer 157 of FIGS. 2A and 2B) within the windows as well as sidewalls 416 in the semiconductor layer structure leading to the such mesas 415 (FIGS. 4K and 4L). These mesas 415 can be at or near the peak ion density of the ion-implanted contact regions 413 formed in step 342.

In step 348, the photoresist mask patterned in step 344 is removed.

In steps 349-353, p-type ions are implanted into the resultant structure to form P+ ion-implanted contact regions 417 for contact to p-type QW channel for certain electrical and optical devices of the IC (including thyristor devices and p-channel HFET devices) and to form P+ ion implanted contact regions 417 for contact to the collector (back-gate) regions for n-channel HFETs of the IC.

In step 349, photoresist is deposited and patterned. The patterned photoresist functions as both an implant mask and etch mask. The patterned photoresist defines windows on the mesas formed in step 335 and 338 to form P+ ion-implanted contact regions 417. For thyristor devices, the nitride layer 402 and patterned metal layers 405a, 405b (FIG. 4H) that overlay the top aperture 401 of the thyristor devices of the IC can act as an implant mask that protects the underlying waveguide region of the thyristor devices for the implant operations that form the P+ ion-implanted contact regions 417 (FIG. 4M). For n-channel HFET devices, the gate metal 405b can act as an implant mask that protects the underlying gate region of the n-channel HFET devices for such implant operations that form the P+ ion-implanted contact regions 417 (FIG. 4N). For p-channel HFET devices, the collector (back-gate) metal 405b can act as an implant mask that protects the underlying collector (back-gate) region of the p-channel HFET devices for such implant operations that form the P+ ion-implanted contact regions 417 (FIG. 4O).

In step 350, an implant of P+ ions (e.g., Be/F ions) is performed through the windows defined by the photoresist mask and into the semiconductor layer structure to form the P+ ion-implanted contact regions 417. These P+ ion-implanted contact regions 417 define p-channel injector contact regions that contact the p-type modulation doped QW channel of the optical and electrical thyristor devices of the IC (FIG. 4M) as well as source and drain contact regions that contact the p-type modulation doped QW channel of the p-channel HFET devices of the IC (FIG. 4O) as well as contact regions that contact the collector (back-gate) region of the p-channel HFET devices of the IC (FIG. 4N). In one embodiment, for the implant operations into the mesas formed in step 335 (corresponding to the collector/back-gate of the n-channel HFET devices), the peak ion density of the P+ ion-implanted contact regions 417 can be at or near a predefined etch stop layer (e.g., layer 28 of FIG. 1 or layer 141 of FIGS. 2A and 2B). For the implant operations into the mesas formed in step 338 (corresponding to the source-drain contact regions of the p-channel HFET devices and p-channel injector regions of the thyristor devices), the peak ion density of the P+ ion-implanted contact regions 417 can be at or near a predefined etch stop layer (e.g., layer 24 of FIG. 1 or layer 137 of FIGS. 2A and 2B). During the implant operation of step 350, the nitride sidewalls formed in step 342 function as lateral implant spacers for certain devices of the IC. Specially, for thyristor devices, the nitride sidewalls protect the top p-type region, the n-type modulation doped QW structure 32, and part of the intermediate spacer layers of the thyristor such that implant operation of step 350 does not reach into these regions of the semiconductor layer structure of the thyristor device. For the p-channel HFET devices, the nitride sidewalls formed in step 342 protects the collector (back-gate) gate regions of the p-channel HFET devices such that the implant operation of step 350 does not reach across such collector (back-gate) regions.

In step 351, a wet etch operation (e.g., using citric acid) is performed that etches through the windows defined by photoresist mask and into the semiconductor layer structure and automatically stops at a predefined etch stop layer (e.g., layer 28 of FIG. 1 or layer 141 of FIGS. 2A and 2B and/or layer 24 of FIG. 1 or layer 137 of FIGS. 2A and 2B) within the windows. This etch operation also etches away the semiconductor layer structure under the exposed nitride sidewalls and removes these nitride sidewalls leaving behind sidewalls in the semiconductor layer structure.

In step 352, a wet etch operation (e.g., using BHF) is performed that etches through the windows defined by photoresist mask to remove remaining portions of the predefined etch stop layer(s) to define mesas 419 at the underlying layer(s) (e.g., spacer layer 26 of FIG. 1 or spacer layer 139 of FIGS. 2A and 2B and/or layer 22 of FIG. 1 or layer 135 of FIGS. 2A and 2B) within the windows as well as sidewalls 421 in the semiconductor layer structure leading to the such mesas 419 for thyristor devices (FIG. 4M), n-channel HFETs (FIG. 4N) and p-channel HFETs (FIG. 4O). These mesas 419 can be at or near the peak ion density of the P+ ion-implanted contact regions 417 formed in step 350.

In step 353, the photoresist patterned in 349 is removed.

In steps 354 to 357, mesas 423 are formed to contacts the bottom N+ ohmic contact layer 14 for certain devices of the IC. In step 354, photoresist is deposited and patterned. The patterned photoresist functions as an etch mask for defining mesas 423 (as well as sidewalls leading to such mesas) that are used to form contact regions to the bottom ohmic contact layer(s) 14 for certain devices of the IC.

In step 355, a wet etch operation (e.g., using citric acid) is performed that uses the photoresist etch mask to etch into the semiconductor layer structure and automatically stop at a predefined etch stop layer (e.g., layer 16 of FIG. 1 or layer 111 of FIGS. 2A and 2B).

In step 356, a wet etch operation (e.g., using BHF) is performed that uses the photoresist etch mask to remove remaining portions of the predefined etch stop layer(s) to define mesas 423 at the underlying layer (e.g., layer 14 of FIG. 1 or layer 109 of FIGS. 2A and 2B) within the windows as well as sidewalls 425 in the semiconductor layer structure leading to the such mesas 423 for thyristor devices (FIG. 4P) and p-channel HFETS (FIG. 4Q). The mesas 423 are used to form contact regions to the bottom n-type ohmic contact layer.

In step 357, the photoresist etch mask patterned in step 354 is removed.

In steps 358 to 359, a thermal anneal process is performed to activate the earlier-implanted ion-implant regions. In step 358, a capping layer of nitride is deposited that covers the structure. In one embodiment, the nitride capping layer has a thickness of 500 Å.

In step 359, a rapid thermal anneal (RTA) process is performed on the structure in order to activate the earlier-implanted ion-implant regions (e.g., the ion-implanted regions 403, 404, 411, 413, and 417 as described herein). In one embodiment, the rapid thermal anneal process is carried out at 850° C. for 15 seconds.

In steps 360-362, nitride sidewalls and other protection areas are defined for post-RTA implantation of oxygen ions and subsequent metallization. In step 360, photoresist is deposited and patterned. The patterned photoresist functions as an etch mask to define sidewalls and other protection areas formed by the nitride capping layer deposited in step 358.

In step 361, an etch operation (e.g., using a dry etchant such as SF6) is performed that uses the photoresist etch mask to etch the nitride capping layer 427 to define the sidewalls and other protection areas formed by the nitride capping layer 427. For the thyristor devices of the IC, the remaining nitride capping layer 427 covers and protects the top anode metal layers 405a, 405b as well as the sidewalls 416 and 421 of the semiconductor layer structure as shown in FIG. 4R. The remaining nitride capping layer 427 functions as lateral spacers for subsequent metallization of the n-channel injectors and p-channel injectors of the thyristor devices. For the n-channel HFET devices, the remaining nitride capping layer 427 covers and protects the sidewalls 416 and the gate region adjacent thereto while leaving the gate metal 405b exposed as shown in FIG. 4S. The remaining nitride capping layer 427 functions as lateral implant spacers that protects the gate region for the n-channel HFETs during subsequent oxygen implant operations such that the implanted oxygen ions do not reach across such gate regions and also functions as lateral spacers during metallization of the source and drain electrodes for the n-channel HFETs. For the p-channel HFET devices, the remaining nitride capping layer 427 covers and protects the sidewalls 421 and the collector (back-gate) region adjacent thereto while leaving the collector (back-gate) metal 405b exposed as shown in FIG. 4T. The remaining nitride capping layer 427 functions as lateral implant spacers that protects the collector (back-gate) region for the p-channel HFETs during subsequent oxygen implant operations such that the implanted oxygen ions do not reach across such collector (back-gate) regions and also functions as lateral spacers during metallization of the source and drain electrodes for the p-channel HFETs. Note that the nitride capping layer 427 is etched away to expose i) the gate metal 405b of the n-channel HFET devices, ii) the collector (back-gate) metal 405b of the p-channel HFET devices, iii) the mesas 415, 419 and 423 for thyristors, n-channel HFETs and p-channel HFETs.

An example of mask feature 505 that is part of the etch mask used to form sidewalls of the nitride capping layer 427 for an n-channel HFET is shown in FIG. 5. Note that the mask feature 505 is configured such that the remaining nitride capping layer 427 covers and protects the sidewalls 416 and the gate region adjacent thereto while leaving the gate metal 405b exposed as shown in FIG. 4S. Specifically, the nitride capping layer 427 can be dry etched with SF6. The dry etch is anisotropic such that any nitride on a vertical surface (a sidewall) is not etched. The etch time can be controlled such that it stops at the gate metal 405b of the n-channel HFET devices and the collector (back-gate) metal 405b of the p-channel HFET devices. Over-etching of the gate metal 405b of the n-channel HFET devices and the collector (back-gate) metal 405b of the p-channel HFET devices can be reduced and/or avoided by combining some indium (for example, (10% by weight) with tungsten for the metal layer 405b, which will slow down the etch rate of the metal layer 405b in the presence of SF6 when etching the nitride capping layer 427 with SF6. This is acceptable during the gate/collector metal etch and will give some protection during the etching the nitride capping layer 427 with SF6.

In step 362, the photoresist etch mask patterned in step 360 is removed.

In steps 363-369, post-RTA implantation of oxygen ions is performed for certain devices of the IC, including p-channel HFETs and n-channel HFETS. In step 363, photoresist is deposited and patterned. The patterned photoresist functions as an implant mask that defines implant windows for certain devices of the IC, including p-channel HFETs. For the p-channel HFETS, such implant windows are slightly larger (for example, 1 um larger) than the photoresist implant mask patterned in step 349 for implantation of P+ ions and can be aligned to the implant windows defined by this mask.

In step 364, oxygen ions are implanted through the implant windows defined by the photoresist implant mask and through the shallow P+ implant regions 417 (now activated) to a depth near 1 μm above the bottom ohmic contact layer (e.g., layer 14 of FIG. 1 or layer 109 of FIGS. 2A and 2B), which corresponds to the gate region of the p-channel HFET device. Such implant operations form oxygen ion-implanted regions 429 under the source and drain P+ ion-implanted regions 417 as shown in FIG. 4T. The oxygen ion-implanted regions 42 reduce the Source/Drain to gate capacitance of the p-channel HFET devices.

In optional step 365, oxygen ions are implanted through the implant windows defined by the photoresist implant mask and through the shallow P+ implant regions 417 (now activated) to a depth at or near the n-type ohmic contact layer 14/109. Such implant operations form oxygen ion-implanted regions 431 between the shallower source and drain P+ ion-implanted regions 417 and the deeper oxygen ion-implanted regions 429 as shown in FIG. 4T. The oxygen ion-implanted regions 431 reduces capacitance and vertical diode conduction of the p-channel HFETs.

Note that the remaining nitride capping layer 427 functions as lateral implant spacers that protects the collector (back-gate) region for the p-channel HFETs during the oxygen implant operations of steps 364 and 365 such that the implanted oxygen ions do not reach across such collector (back-gate) regions.

In step 366, the photoresist implant mask patterned in step 363 is removed.

In step 367, photoresist is deposited and patterned. The patterned photoresist functions as an implant mask that defines implant windows for certain devices of the IC, including n-channel HFETs. For the n-channel HFETS, such implant windows are slightly larger (for example, 1 um larger) than the photoresist implant mask patterned in step 344 for implantation of N+ ions and can be aligned to the implant windows defined by this mask.

In step 368, oxygen ions are implanted through the implant windows defined by the photoresist implant mask and through the shallow N+ implant regions 413 (now activated) to a depth at or near spacer layer 26/139. Such implant operations form oxygen ion-implanted regions 433 between the shallower source or drain N+ ion-implanted region 4153 and the deeper oxygen ion-implanted region 431 as shown in FIG. 4S. The oxygen ion-implanted regions 433 reduces drain-induced barrier lowering (DIBL) of the n-channel HFETs.

Note that the remaining nitride capping layer 427 functions as lateral implant spacers that protects the gate region for the p-channel HFETs during the oxygen implant operation of step 368 such that the implanted oxygen ions do not reach across such gate regions.

In step 369, the photoresist implant mask patterned in step 367 is removed.

In steps 370-374, metallization is performed certain devices of the IC, including metallization of electrodes that are in contact with the N+ ion-implanted regions (for electrical contact to the n-type modulation doped QW structure 32), metallization of electrodes that are in contact with the P+ ion-implanted regions (for electrical contact to the p-type modulation doped QW structure 22), and metallization of electrodes that are in contact with the bottom n-type ohmic contact layer(s) of the device structure. In step 370, a stack of refractory metals is deposited on the structure. The metal stack 435 is formed in contact with the portions of the structure where the nitride capping layer is etched away in step 360, which includes the gate metal 405b of the n-channel HFET devices, the collector (back-gate) metal 405b of the p-channel HFET devices, and the mesas 415, 419, and 423 for thyristors, n-channel HFETs and p-channel HFETs. Note that the remaining nitride capping layer 427 functions as lateral spacers that offsets the metal stack 435 from the sidewalls 416 and 421 of the device structure for the thyristors as shown in FIG. 4U, for the n-channel HFETs as shown in FIG. 4V, and for the p-channel HFETs as shown in FIG. 4W. The nitride spacers can access resistance; however, the corresponding ion-implanted regions can be disposed under the nitride spacers in order to reduce the access resistance.

In step 371, the resulting structure is heated to anneal the metal stack 435 such that it forms a low resistance interface to the underlying semiconductor layer. Such heating can also be configured as anneal step that transforms the oxygen implanted regions 431 and 433 into a high resistance state. In one embodiment, the resulting structure is heated at a temperature of 600° C. for 10 seconds in order to anneal the metal stack 435 that it forms a low resistance interface to the underlying semiconductor layer and transforms the oxygen implanted regions 431 and 433 into a high resistance state. The metal stack 435 after the anneal operation is labeled 435' herein. The high-resistance state of the oxygen ion-implanted regions 431 and 433 after heating can provide localized resistance greater than $10^8$ ohms/square.

In step 372, photoresist is deposited and patterned. The patterned photoresist functions as an etch mask to pattern the annealed metal stack 435' to form electrodes that are in contact with the N+ ion-implanted regions, electrodes that are in contact with the P+ ion-implanted regions and electrodes that are in contact with the bottom n-type ohmic contact layer(s) of the device structure.

In step 373, an etch operation is performed using the photoresist etch mask to pattern the annealed metal stack 435'. For thyristor devices, the annealed metal stack 435' is patterned to form n-channel injector electrodes on mesas 415 in contact with the N+ ion-implanted regions 413, the p-channel injector electrode on mesas 419 in contact with the P+ ion-implanted regions 417 and the cathode electrodes on mesas 423 in the bottom ohmic contact layer as shown in FIG. 4X. The etch operation also etches away the nitride capping layer 427 that overlies the cumulative metal layers 405b, 405a that cover the top apertures 401 of the thyristor devices as shown in FIG. 4X. For n-channel HFET devices, the annealed metal stack 435' is patterned to form source and drain electrodes on the mesas 415 in contact with the N+ ion-implanted regions 413 and the collector (back-gate) electrodes on the mesas 419 in contact with the P+ ion-implanted regions 417 as shown in FIG. 4Y. The etch operation also etches away the nitride capping layer 427 that overlies the metal layers 405b that cover the gate metal 405b to expose the gate electrodes of the n-channel HFET devices as shown in FIG. 4Y. For p-channel HFET devices, the annealed metal stack 435' is patterned to form source and drain electrodes on the mesas 419 in contact with the P+ ion-implanted regions 417 and one or more gate electrodes (two shown) on the mesas 4-423 in contact with the bottom n-type ohmic contact layers 14 as shown in FIG. 4Z. The etch operation also etches away the nitride capping layer 427 that overlies the metal layers 405b that cover the collector (back-gate) metal 405b to expose the collector (back-gate) electrode of the p-channel HFET devices as shown in FIG. 4Z.

An example of mask features 507a, 507b that are part of the etch mask used to pattern the annealed metal stack 435' to form the source and drain electrodes for an n-channel HFET is shown in FIG. 5. The features 507a, 507b corresponds to the layout of the source and drain electrodes of the n-channel HFET as described herein.

In step 374, the photoresist etch mask patterned in step 372 is removed.

Figures 6A, 6B:
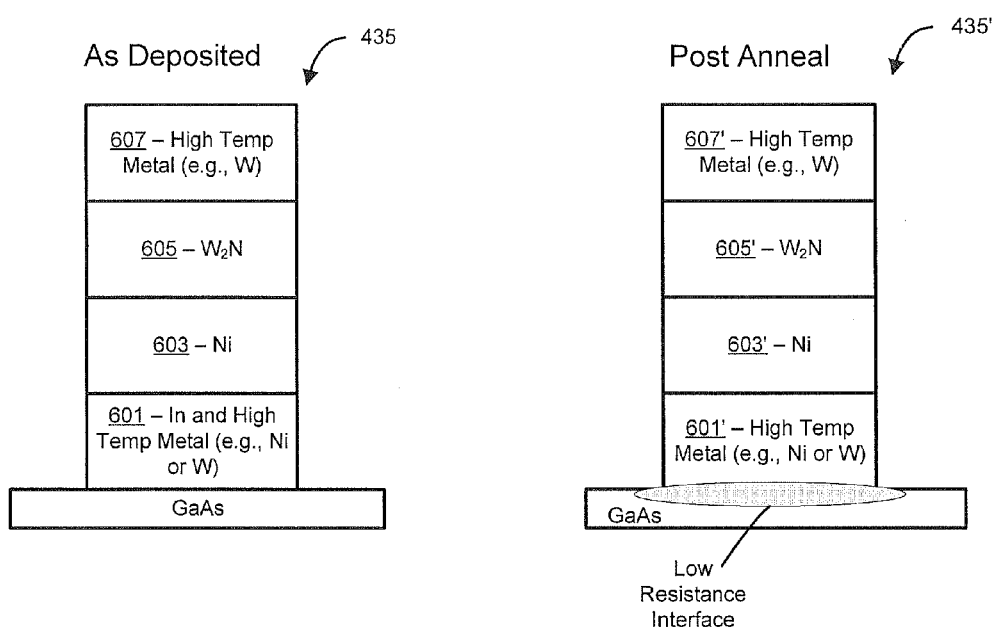
FIG. 6A is a schematic view of an exemplary multi-layer metal stack (as deposited), which can be used to form electrodes for certain devices of the optoelectronic integrated circuit as described herein.
FIG. 6B is a schematic view of the exemplary multi-layer metal stack of FIG. 6A after an anneal operation.

In one embodiment, the metal stack 435 includes four layers 601, 603, 605, and 607 (from bottom to top) as shown in FIG. 6A. The bottom first layer 601 is formed from a combination of indium (In) with one or more high temperature metals (i.e., a metal with a melting point above 1200° C.). Suitable high temperature metals with a melting point above 1200° C. include, but are not limited to, tungsten (W), nickel (Ni), tantulum (Ta), molybdenum (Mo), and combinations thereof. The first layer 601 preferably has a thickness of 200 Å. The first layer 601 can be formed by co-sputtering indium with the one or more high temperature metals or other suitable means. Note that during the heating of the metal stack 435 as described herein, the indium content of the first layer 601 can react with the n-type or p-type doped GaAs semiconductor material that underlies the first layer 601 to provide low resistance interface between the first layer 601' and the underlying n-type or p-type doped GaAs semiconductor material as shown in FIG. 6B. The second layer 603 is formed from nickel (Ni). The second layer preferably has a thickness of 250 Å. The second layer 603 can be formed by sputtering nickel or other suitable means. The third layer 605 is formed from tungsten nitride ($W_2N$). The third layer 605 preferably has a thickness of 250 Å. The third layer of tungsten nitride can be formed by sputtering tungsten (W) in a mixed gas of argon (Ar) and nitrogen ($N_2$) or other suitable means. The second layer 603 of nickel and the third layer 605 of tungsten nitride function together as a barrier layer to the diffusion of the indium component of the first layer 601 upward to the fourth layer 607 during the heating of the metal stack 435. The fourth layer 607 is formed from one or more high temperature metals (i.e., a metal with a melting point above 1200° C.). Suitable high temperature metals with a melting point above 1200° C. include, but are not limited to, refractory metals such as tungsten (W), tantulum (Ta), molybdenum (Mo), and combinations thereof. The fourth layer 607 preferably has a thickness of 1000 Å.

The annealed metal stack 435' formed by the heating of the metal stack 435 can include four corresponding metal layers 601', 603', 605' and 607' (from the bottom to the top) as shown in FIG. 6B. The metal layer 601' is formed primarily from the high temperature metal content (e.g., nickel or tungsten) of layer 601 of the as-deposited metal stack 435. The metal layer 603' is formed primarily from the nickel content of layer 603 of the as-deposited metal stack 435. The metal layer 605' is formed primarily from the tungsten nitride content of layer 605 of the as-deposited metal stack 435. The metal layer 607' is formed primarily from the high temperature metal content (e.g., tungsten) of layer 607 of the as-deposited metal stack 435. Note that during the anneal process of the metal stack, the indium content of the first layer 601 can react with the n-type or p-type doped GaAs semiconductor material that underlies the first layer 601 to provide low resistance interface between the metal layer 601' and the underlying n-type or p-type doped GaAs semiconductor material as shown.

In this embodiment, the etching operation of the annealed metal stack 435' can involve a series of etches as follows. First, the metal layer 607' and the metal layer 605' of tungsten nitride can be etched by a suitable etchant (such as a dry etch of sulfur hexafluoride (SF6)). Then, the metal layer 603' of nickel can be etched in a suitable wet nickel etchant. Finally, the bottom metal layer 601' can be etched in a suitable etchant. For the case where the metal layer 601' is formed primarily from nickel, a suitable wet nickel etchant can be used to etch the metal layer 601'. For the case where the metal layer 601' is formed primarily from tungsten, a dry etch of sulfur hexafluoride (SF6) or a suitable wet tungsten etchant can be used to etch the metal layer 601'.

In steps 375-378, metallization is performed certain devices of the IC, including metallization of top anode electrodes for thyristor devices of the IC. In step 375, photoresist is deposited and patterned. The patterned photoresist functions as an etch mask to pattern the cumulative metal layers 405a, 405b that covers the apertures 401 of the thyristor devices of the IC.

In step 376, an etch operation is performed using the photoresist etch mask to pattern the cumulative metal layers 405b, 405a that covers the apertures 401 of the thyristor devices of the IC. The patterning of the cumulative metal layers 405b, 405a can be configured to form two anode electrode portions on opposite sides of the aperture 401 that are in contact with the top P-type region of the device structure as shown in FIG. 4ZA.

In step 377, an etch operation is performed using the photoresist etch mask to remove the nitride layer 402 that covers the top aperture 401 for the thyristor devices of the IC.

In step 378, the photoresist etch mask patterned in step 375 is removed.

In step 379, one or more nitride dielectric layer(s) are deposited on the resultant structure.

In step 380, photoresist is deposited and patterned. The photoresist functions as an etch mask for patterning the nitride dielectric layer(s) to define contact windows for electrical interconnections.

In step 381, an etching operation is performed using the photoresist etch mask that patterns the nitride dielectric layer(s) to open contact windows for electrical interconnections of the IC. Note that since the metal stack 435 is deposited after the nitride capping layer 427, then the annealed metal stack 435' can perform the first layer of interconnect by passing over mesa edges as desired.

In step 382, the photoresist etch mask patterned in step 380 is removed.

In step 383, photoresist is deposited and patterned. The photoresist functions as an etch mask for patterning the nitride dielectric layer(s) to define optical apertures for vertical cavity light-emitting and/or light-detecting devices.

In step 384, an etching operation is performed using the photoresist etch mask that patterns the nitride dielectric layer(s) to open optical apertures for vertical cavity light-emitting and/or light-detecting devices. For the case, where optical thyristors are used as vertical cavity light-emitting and/or light-detecting devices, the optical apertures formed in the nitride dielectric layers are aligned to the top apertures 401 of the thyristor devices.

In step 385, the photoresist etch mask patterned in step 383 is removed.

In step 386, photoresist is deposited and patterned. The photoresist functions as an etch mask for patterning the nitride dielectric layer(s) to define connections to bond pads for devices of the IC.

In step 387, an etching operation is performed using the photoresist etch mask that patterns the nitride dielectric layer(s) to open connections to bond pads for devices In step 388, the photoresist etch mask patterned in step 386 is removed.

In step 389, photoresist is deposited and patterned. The photoresist functions as an etch mask for an isolation etch down to near the substrate 101. This can be used for all devices of the IC.

In step 390, an isolation etching operation is performed using the photoresist etch mask that etches down to near the substrate 101. This can be used for all devices of the IC.

In step 391, the photoresist etch mask patterned in step 389 is removed.

In optional step 392, the bottom mirror layers that are exposed by the isolation etch of step 390 can be subject to oxidation. This operation is useful for the case where the bottom mirror layers as formed as part of the layer structure do not function as a suitable DBR mirror. In one embodiment, the bottom mirror layers of AlAs (e.g., layer(s) 103, 107 of FIGS. 2A and 2B) that exposed by the isolation etch are subject to a steam ambient that converts the AlAs to AlO, which form the bottom DBR mirror. Note that any AlAs etch stop layer above the AlAs bottom mirror layers that have been exposed during early processing can be protected by nitride layer(s) such that oxygen does not reach and react with the AlAs etch stop layers. After oxidation of the bottom mirror layers, the top DBR mirror layers can be deposited. In one example, the top DBR mirrors comprise alternating layers of SiO2 and a high refractive index material such as Si, TiO2, GaAs, or GaN. The top DBR mirrors can be formed in the top apertures that have been opened for all optical devices, including optical thyristor devices.

Note that the top aperture 401 of the device structure as described above can be configured to allow for light to exit or enter into the active region of the device structure. Alternatively, the top aperture 401 of the device structure can be used to form a passive and/or active in-plane waveguide structures as part of optoelectronic device realized in an IC as described herein. Such in-plane waveguide guides the propagation of light in the plane of the IC, and the top aperture 401 formed at the top surface provides for vertical confinement and wave guiding of light for the top portion of the IC wafer. For the passive in-plane waveguide structure, the patterned anode metal can be omitted and the ion-implanted regions 403, 404 formed below opposite sides of the top aperture 401 provide for lateral confinement of light within the active region of the device structure disposed below the top aperture 401.

In alternate embodiment, the cumulative metal layers as formed in step 321 and subsequently processed can include an additional layer of etch stop material (e.g., chromium) that is formed on the cumulative metal layers 405b, 405a that form the anode metal for the thyristors of the IC. The additional layer of etch stop material can function as an etch stop when etching (patterning) the annealed metal stack 435' for the thyristors in step 373 as described herein. In this case, the additional layer of etch stop material protects the underlying cumulative metal layers 405b, 405a against the etching of the annealed metal stack 435' formed thereabove. In one embodiment where the annealed metal stack 435' is finally etched away using sulfur hexafluoride (SF6), the additional layer of etch stop material can be chromium (which is not etched by SF6). The additional layer of etch stop material can be removed when patterning the cumulative metal layers 405b, 405a in forming the anode electrodes of the thyristors in step 376. Note that the additional layer of etch stop material formed on the cumulative metal layers 405b, 405a can be avoided where the annealed metal stack 435' is finally etched away using a suitable etchant (such as a wet nickel etchant) that does not etch the metal (e.g., tungsten) of the cumulative metal layers 405b, 405a.

It is also contemplated that the layer structure as described herein can include a metamorphic buffer structure formed on the substrate 10 between the bottom DBR mirror layer(s) 12 and the bottom n-type layers of the active device structure.

The metamorphic buffer structure can employ a plurality of layers that are configured to accommodate lattice strain due to mismatch between the active device structure and the substrate 10. An example of such a metamorphic buffer structure is described in U.S. patent application Ser. No. 14/222,841, filed on Mar. 24, 2014, commonly assigned to assignee of the present application and herein incorporated by reference in its entirety.

There have been described and illustrated herein several embodiments of methods for forming optoelectronic integrated circuits employing complementary modulation doped quantum well structures. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the optoelectronic integrated circuitry as described herein. It will therefore be appreciated by those skilled in the art that yet other modifications could be made to the provided invention without deviating from its spirit and scope as claimed.

What is claimed is:

1. A semiconductor device comprising:
   a series of layers formed on a substrate, the series of layers including:
      a first plurality of layers comprising:
         an n-type ohmic contact layer; and
         a first etch stop layer that is formed on the n-type ohmic contact layer;
      a first spacer layer disposed on the first plurality of layers;
      a second plurality of layers that form a p-type modulation doped quantum well (QW) structure, wherein the p-type modulation doped QW structure is disposed on the first spacer layer;
      a third plurality of layers disposed between the p-type modulation doped QW structure and a fourth plurality of layers that form an n-type modulation doped QW structure, the third plurality of layers comprising:
         a second etch stop layer formed above the p-type modulation doped QW structure;
         a second spacer layer disposed on the second etch stop layer;
         a third etch stop layer formed above the second spacer layer; and
         a third spacer layer disposed above the third etch stop layer;
         a fourth spacer layer disposed above the fourth plurality of layers;
      a fifth plurality of layers comprising:
         a fourth etch stop layer formed above the fourth spacer layer;
         a fifth etch stop layer formed above and offset from the fourth etch stop layer; and
         a p-type ohmic contact layer formed above the fifth etch stop layer; and
   a multilayer metal stack formed on at least one of first through third mesas, the multilayer metal stack comprising:
      a bottom layer of indium;
      a layer of nickel deposited on the bottom layer of indium;
      a layer of tungsten nitride deposited on the layer of nickel; and
      a top layer of a high temperature metal deposited on the layer of tungsten nitride;
      wherein:
         (i) the first mesa is formed on the second spacer layer,
         (ii) the second mesa is formed on the fourth spacer layer, and
         (iii) the third mesa is formed on the n-type ohmic contact layer.

2. The semiconductor device of claim 1, wherein the second and third etch stop layers are undoped.

3. The semiconductor device of claim 1, wherein the first etch stop layer, the second etch stop layer, the third etch stop layer, the fourth etch stop layer, and the fifth etch stop layer each comprises AlAs.

4. The semiconductor device of claim 1, wherein the series of layers comprise III-V semiconductor materials.

5. The semiconductor device of claim 4, wherein the III-V semiconductor materials comprise GaAs materials.

6. The semiconductor device of claim 1, wherein the second spacer layer includes a first quantum dot in QW (QD-in-QW) structure and the third spacer layer includes a second QD-in-QW structure.

7. The semiconductor device of claim 1, wherein the high temperature metal is at least one of tungsten, tantalum, and molybdenum.

\* \* \* \* \*